US012765210B2

(12) United States Patent
Zhou et al.

(10) Patent No.: US 12,765,210 B2
(45) Date of Patent: Oct. 13, 2026

(54) DISPLAY SUBSTRATE, PREPARATION METHOD THEREFOR, AND DISPLAY APPARATUS

(71) Applicants: Chengdu BOE Optoelectronics Technology Co., Ltd., Chengdu (CN); BOE Technology Group Co., Ltd., Beijing (CN)

(72) Inventors: Hongjun Zhou, Beijing (CN); Chengjie Qin, Beijing (CN); Quan Shi, Beijing (CN); Yanwei Lu, Beijing (CN)

(73) Assignees: Chengdu BOE Optoelectronics Technology Co., Ltd., Chengdu (CN); BOE Technology Group Co., Ltd., Beijing (CN)

(*) Notice: Subject to any disclaimer, the term of this patent is extended or adjusted under 35 U.S.C. 154(b) by 358 days.

(21) Appl. No.: 18/577,716

(22) PCT Filed: Aug. 9, 2022

(86) PCT No.: PCT/CN2022/111082
§ 371 (c)(1),
(2) Date: Jan. 9, 2024

(87) PCT Pub. No.: WO2024/031315
PCT Pub. Date: Feb. 15, 2024

(65) Prior Publication Data
US 2025/0098468 A1 Mar. 20, 2025

(51) Int. Cl.
*H10K 59/131* (2023.01)
*H10K 59/121* (2023.01)
*H10K 59/35* (2023.01)

(52) U.S. Cl.
CPC ....... *H10K 59/353* (2023.02); *H10K 59/1213* (2023.02); *H10K 59/1216* (2023.02); *H10K 59/131* (2023.02)

(58) Field of Classification Search
CPC ............. H10K 59/121; H10K 59/1213; H10K 59/1216; H10K 59/131; H10K 59/352;
(Continued)

(56) References Cited

U.S. PATENT DOCUMENTS 12,063,819 B2 * 8/2024 Shang ................ H10K 59/1201
2021/0043135 A1 2/2021 Zhao et al.
(Continued)

FOREIGN PATENT DOCUMENTS

CN 110188744 A 8/2019
CN 110459175 A 11/2019
(Continued)

OTHER PUBLICATIONS

International Search Report for PCT/CN2022/111082 Mailed Jan. 11, 2023.
European Search Report for 22954295.6 Mailed Jun. 30, 2025.

*Primary Examiner* — Telly D Green

(57) ABSTRACT

A display substrate and a preparation method therefor, and a display apparatus are provided. The display substrate includes a drive circuit layer (102) and a light emitting structure layer (103) arranged on a base substrate (101), the drive circuit layer (102) includes a plurality of circuit units, at least one circuit unit is provided with at least one light transmitting region, the light emitting structure layer (103) includes a plurality of light emitting units, the light emitting unit at least includes an anode, and the light transmitting region is located between adjacent anodes; and there is a first dimension between two adjacent anodes in two adjacent pixel rows, and the light transmitting region has a second dimension, wherein a ratio of the second dimension to the first dimension is greater than or equal to 0.5.

18 Claims, 11 Drawing Sheets

(58) Field of Classification Search
CPC . H10K 59/353; H10K 59/65; H10K 59/80515
See application file for complete search history.

(56) References Cited

U.S. PATENT DOCUMENTS

| | | | | |
|---|---|---|---|---|
| 2021/0183991 | A1 | 6/2021 | Shin et al. | |
| 2021/0335853 | A1 | 10/2021 | Qin et al. | |
| 2021/0351253 | A1 | 11/2021 | Yuan | |
| 2021/0408200 | A1 | 12/2021 | Zhao et al. | |
| 2022/0302234 | A1 | 9/2022 | Xue et al. | |
| 2022/0310705 | A1 | 9/2022 | Chen | |
| 2022/0320226 | A1 | 10/2022 | Yang et al. | |
| 2022/0320247 | A1 | 10/2022 | Liu et al. | |
| 2022/0328579 | A1* | 10/2022 | Shang | H10K 59/1201 |
| 2023/0419897 | A1 | 12/2023 | Zhang et al. | |

FOREIGN PATENT DOCUMENTS

| | | | | | |
|---|---|---|---|---|---|
| CN | 110491918 | A | | 11/2019 | |
| CN | 110867479 | A | * | 3/2020 | H10K 59/1213 |
| CN | 210535236 | U | * | 5/2020 | |
| CN | 111524932 | A | | 8/2020 | |
| CN | 112072000 | A | | 12/2020 | |
| CN | 112992924 | A | | 6/2021 | |
| CN | 113053924 | A | | 6/2021 | |
| CN | 113745272 | A | * | 12/2021 | H10K 59/122 |
| CN | 114097089 | A | | 2/2022 | |
| CN | 116918489 | A | | 10/2023 | |
| WO | WO-2021190508 | A1 | * | 9/2021 | G09G 3/3233 |
| WO | WO-2021217993 | A1 | * | 11/2021 | H10D 84/01 |

* cited by examiner

DISPLAY SUBSTRATE, PREPARATION METHOD THEREFOR, AND DISPLAY APPARATUS

CROSS-REFERENCE TO RELATED APPLICATION

The present application is a U.S. National Phase Entry of International Application No. PCT/CN2022/111082 having an international filing date of Aug. 9, 2022. The above-identified application is hereby incorporated by reference.

TECHNICAL FIELD

The present disclosure relates to, but is not limited to, the field of display technologies, and particularly to a display substrate and a preparation method therefor, and a display apparatus.

BACKGROUND

An Organic Light Emitting Diode (OLED) and a Quantum dot Light Emitting Diode (QLED) are active light emitting display devices and have advantages such as self-luminescence, a wide viewing angle, a high contrast ratio, low power consumption, an extremely high response speed, lightness and thinness, flexibility, and a low cost. With constant development of display technologies, a flexible display apparatus (Flexible Display) in which an OLED or a QLED is used as a light emitting device and signal control is performed through a Thin Film Transistor (TFT) has become a mainstream product in the field of display at present.

SUMMARY

The following is a summary of subject matter described herein in detail. The summary is not intended to limit the scope of protection of the claims.

In one aspect, the present disclosure provides a display substrate including a drive circuit layer arranged on a base substrate and a light emitting structure layer arranged at a side of the drive circuit layer away from the base substrate, wherein the drive circuit layer includes a plurality of circuit units forming a plurality of unit rows and a plurality of unit columns, and the light emitting structure layer includes a plurality of light emitting units forming a plurality of pixel rows and a plurality of pixel columns; a circuit unit includes at least a pixel drive circuit, a light emitting unit includes at least one anode, and an anode of at least one light emitting unit is connected to a pixel drive circuit of a corresponding circuit unit; at least one circuit unit is provided with at least one light transmitting region located between adjacent anodes; there is a first dimension between two adjacent anodes in two adjacent pixel rows, and the light transmitting region has a second dimension, wherein a ratio of the second dimension to the first dimension is greater than or equal to 0.5, the first dimension is a minimum distance between edges of two adjacent anodes, and the second dimension is a maximum distance between edges of the light transmitting region.

In an exemplary implementation, the plurality of light emitting units may include a first light emitting unit which emits a first color light, a second light emitting unit which emits a second color light, and a third light emitting unit which emits a third color light, wherein the first light emitting unit, the second light emitting unit, and the third light emitting unit are periodically arranged in a direction of the pixel rows, the first light emitting unit, the second light emitting unit, and the third light emitting unit of adjacent pixel rows are dislocated, and anodes of the plurality of light emitting units in an odd-numbered pixel row and an adjacent even-numbered pixel row are correspondingly connected to pixel drive circuits of a plurality of circuit units in the same unit row.

In an exemplary implementation, the light transmitting region includes a first light transmitting region and a second light transmitting region; the first light transmitting region is located between an anode of a first light emitting unit in an odd-numbered pixel row and an anode of a second light emitting unit in an adjacent even-numbered pixel row, and the second light transmitting region is located on a side of the anode of the second light emitting unit away from the first light transmitting region; or the first light transmitting region is located between an anode of a second light emitting unit in an odd-numbered pixel row and an anode of a third light emitting unit in an adjacent even-numbered pixel row, and the second light transmitting region is located on a side of the anode of the third light emitting unit away from the first light transmitting region; or the first light transmitting region is located between an anode of a third light emitting unit in an odd-numbered pixel row and an anode of a first light emitting unit in an adjacent even-numbered pixel row, and the second light transmitting region is located on a side of the anode of the first light emitting unit away from the first light transmitting region.

In an exemplary implementation, an area of the first light transmitting region is larger than an area of the second light transmitting region.

In an exemplary implementation, a transmittance of the first light transmitting region is greater than or equal to 60%, and a transmittance of the second light transmitting region is greater than or equal to 60%.

In an exemplary implementation, the pixel drive circuit at least includes a storage capacitor, a first transistor, a second transistor, a third transistor, and a fourth transistor; in a circuit unit of at least one circuit row, a first electrode of the first transistor is connected to an initial signal line, a second electrode of the second transistor is connected to a second electrode of the third transistor, a first electrode of the third transistor is connected to a second electrode of the fourth transistor, and a first electrode of the fourth transistor is connected to a data signal line; the second transistor of at least one circuit unit of the M-th circuit row is arranged on a side of the storage capacitance close to the M+1 circuit row, the first transistor of the at least one circuit unit of the M-th circuit row is arranged on a side of the storage capacitance away from the (M+1)-th circuit row, a first electrode of the second transistor of the at least one circuit unit of the M-th circuit row and a second electrode of the first transistor of the at least one circuit unit of the (M+1)th circuit row are of an integral structure connected with each other, wherein M is a positive integer greater than or equal to 1.

In an exemplary implementation, at least one circuit unit further includes a first scan signal line and a second scan signal line, wherein the first scan signal line is connected to a gate electrode of the second transistor and a gate electrode of the fourth transistor, and the second scan signal line is connected to a gate electrode of the first transistor; the first scan signal line of at least one circuit unit of the M-th circuit row is arranged on a side of the storage capacitance close to the (M+1)-th circuit row, and the second scan signal line of at least one circuit unit of the M-th circuit row is arranged on a side of the storage capacitance away from the (M+1)-th circuit row.

In an exemplary implementation, the pixel drive circuit further includes a fifth transistor and a sixth transistor, wherein a first electrode of the fifth transistor is connected to a first power supply line, a second electrode of the fifth transistor is connected to the first electrode of the third transistor, a first electrode of the sixth transistor is connected to the second electrode of the third transistor, and a second electrode of the sixth transistor is connected to the anode; at least one circuit unit further includes a light emitting control signal line, which is connected to a gate electrode of the fifth transistor and a gate electrode of the sixth transistor; and in at least one circuit unit, the light emitting control signal line is arranged on a side of the second scan signal line close to the storage capacitor.

In an exemplary implementation, in at least one circuit unit of at least one circuit row, a first pitch between an edge of the first scan signal line close to the light emitting control signal line and an edge of the light emitting control signal line close to the first scan signal line is 0.33*L to 0.37*L, wherein L is a dimension of the circuit unit in a direction of the unit columns.

In an exemplary implementation, in at least one circuit unit of at least one circuit row, a second pitch between an edge of the second scan signal line close to the light emitting control signal line and an edge of the light emitting control signal line close to the second scan signal line is 0.20*L to 0.24*L, and L is a dimension of the circuit unit in a direction of the unit columns.

In an exemplary implementation, in at least one circuit unit, the initial signal line is arranged between the second scan signal line and the light emitting control signal line.

In an exemplary implementation, in at least one circuit unit of at least one circuit row, a third pitch between an edge of a side of the initial signal line close to the light emitting control signal line and an edge of a side of the light emitting control signal line close to the initial signal line is 0.12*L to 0.16*L, wherein L is a dimension of the circuit unit in a direction of the unit column.

In an exemplary implementation, at least one circuit unit is formed with a first light transmitting region of the light transmitting region, an orthographic projection of the first light transmitting region on a plane of the display substrate has a first projection area, which is greater than or equal to 0.02*S, wherein S is an area of an orthographic projection of the circuit unit on the plane of the display substrate.

In an exemplary implementation, in a direction of the unit rows, the first light transmitting region is located between a second electrode of the sixth transistor and the first power supply line, and in a direction of the unit columns, the first light transmitting region is located between the initial signal line and the light emitting control signal line.

In an exemplary implementation, at least one circuit unit is formed with a second light transmitting region of the light transmitting region, an orthographic projection of the second light transmitting region on a plane of the display substrate has a second projection area, which is greater than or equal to 0.02*S, wherein S is an area of an orthographic projection of the circuit unit on the plane of the display substrate.

In an exemplary implementation, in a direction of the unit rows, the second light transmitting region is located between the data signal line and the first power supply line, and in a direction of the unit columns, the second light transmitting region is located between the first scan signal line of circuit unit in the M-th circuit row and the second scan signal line of circuit unit in the (M+1)-th circuit row.

In an exemplary implementation, the storage capacitor includes a first electrode plate, a second electrode plate, and a dielectric layer arranged between the first electrode plate and the second electrode plate, wherein an orthographic projection of the first electrode plate on the plane of the display substrate is at least partially overlapped with an orthographic projection of the second electrode plate on the plane of the display substrate, and a thickness of the dielectric layer is 90 nm to 110 nm.

In an exemplary implementation, the first electrode plate has a first length of 0.25*L to 0.30*L, and the first length is a dimension of the first electrode plate in a direction of the unit column, wherein L is a dimension of the circuit unit in a direction of the unit columns.

In an exemplary implementation, the second electrode plate has a second length of 0.30*L to 0.33*L, and the second length is a dimension of the second electrode plate in a direction of the unit columns, wherein L is a dimension of the circuit unit in a direction of the unit columns.

In an exemplary implementation, the light emitting structure layer further includes a pixel definition layer provided with a plurality of pixel openings and post spacers, wherein the pixel opening exposes the anode, and the post spacer is arranged between adjacent pixel openings; in one unit row, an orthographic projection of the post spacer on the base substrate is at least partially overlapped with an orthographic projection of the first transistor on the base substrate, and in adjacent another unit row, an orthographic projection of the post spacer on the base substrate is at least partially overlapped with an orthographic projection of the storage capacitor on the base substrate.

In another aspect, the present disclosure further provides a display apparatus, including the display substrate described above.

In another aspect, the present disclosure further provides a preparation method for a display substrate, including:

forming a drive circuit layer on a base substrate, which includes a plurality of circuit units forming a plurality of unit rows and a plurality of unit columns, wherein the circuit unit includes at least a pixel drive circuit, at least one circuit unit is provided with at least one light transmitting region having a second dimension, and the second dimension is a maximum distance between two edges of the light transmitting region;

forming a light emitting structure layer on the drive circuit layer, wherein the light emitting structure layer includes a plurality of light emitting units forming a plurality of pixel rows and a plurality of pixel columns, the light emitting unit at least includes an anode, and the anode of at least one light emitting unit is connected with a pixel drive circuit of a corresponding circuit unit; and the light transmitting region is located between adjacent anodes, there is a first dimension between two adjacent anodes in two adjacent pixel rows, the first dimension is a minimum distance between edges of two adjacent anodes, and a ratio of the second dimension to the first dimension is greater than or equal to 0.5.

After the drawings and the detailed descriptions are read and understood, the other aspects may be comprehended.

BRIEF DESCRIPTION OF DRAWINGS

The accompany drawings are used to provide further understanding of the technical solution of the present disclosure, and form a part of the description. The accompany drawings and embodiments of the present disclosure are adopted to explain the technical solution of the present disclosure, and do not form limits to the technical solution of the present disclosure.

Figure 1:
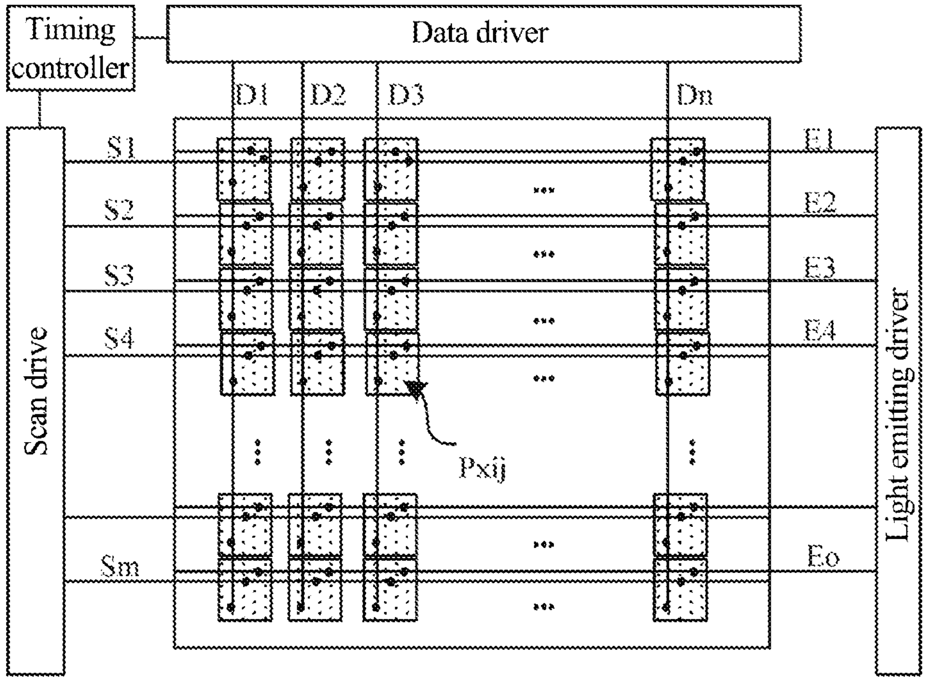
FIG. 1 is a schematic diagram of a structure of a display apparatus.

| Reference signs are described as follows. | | |
|---|---|---|
| 11-first active layer; | 12-second active layer; | 13-third active layer; |
| 14-fourth active layer; | 15-fifth active layer; | 16-sixth active layer; |
| 17-seventh active layer; | 21-first scan signal line; | 22-second scan signal line |
| 23-light emitting control signal line; | 24-first electrode plate; | 31-first initial signal line; |
| 32-second electrode plate; | 33-plate connection line; | 34-shielding electrode; |
| 35-opening; | 41-first connection electrode; | 42-second connection electrode; |
| 43-third connection electrode; | 44-data connection electrode; | 45-first power supply line; |
| 51-first anode; | 52-second anode; | 53-third anode; |
| 71-first protrusion portion; | 72-second protrusion portion; | 73-third protrusion portion; |
| 74-fourth protrusion portion; | 75-fifth protrusion portion; | 76-sixth protrusion portion; |
| 81-pixel opening; | 82-post spacer; | 101-base substrate; |
| 102-drive circuit layer; | 103-light emitting structure layer; | 104-encapsulation structure layer. |

DETAILED DESCRIPTION

To make the objectives, technical solutions, and advantages of the present disclosure clearer, the embodiments of the present disclosure will be described in detail below in combination with the accompany drawings. It is to be noted that the implementations may be implemented in various forms. Those of ordinary skill in the art can easily understand such a fact that modes and contents may be transformed into various forms without departing from the purpose and scope of the present disclosure. Therefore, the present disclosure should not be explained as being limited to the contents recorded in the following implementations only. The embodiments and features in the embodiments of the present disclosure may be randomly combined with each other in case of no conflicts.

Scales of the drawings in the present disclosure may be used as a reference in actual processes, but are not limited thereto. For example, a width-length ratio of a channel, a thickness and spacing of each film layer, and a width and spacing of each signal line may be adjusted according to actual needs. A quantity of pixels in a display substrate and a quantity of sub-pixels in each pixel are not limited to numbers shown in the drawings. The drawings described in the present disclosure are schematic structural diagrams only, and one mode of the present disclosure is not limited to shapes, numerical values, or the like shown in the drawings.

Ordinal numerals “first”, “second”, “third”, etc., in the specification are set not to form limits in number but only to avoid the confusion of composition elements.

In the specification, for convenience, expressions “central”, “above”, “below”, “front”, “back”, “vertical”, “horizontal”, “top”, “bottom”, “inside”, “outside”, etc., indicating orientation or positional relationships are used to illustrate positional relationships between the composition elements, not to indicate or imply that involved devices or elements are required to have specific orientations or be structured and operated with the specific orientations but only to easily and simply describe the present specification, and thus should not be understood as limits to the present disclosure. The positional relationships between the composition elements may be changed as appropriate according to the direction where each composition element is described. Therefore, appropriate replacements based on situations are allowed, not limited to the expressions in the specification.

In the specification, unless otherwise specified and defined, terms “mounting”, “mutual connection”, and “connection” should be generally understood. For example, the connection may be fixed connection, or detachable connection, or integral connection. The connection may be mechanical connection or electric connection. The connection may be direct connection, or indirect connection through an intermediate, or communication inside two elements. Those of ordinary skill in the art can understand specific meanings of the above terms in the present disclosure according to specific situations.

In the specification, a transistor refers to an element that at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current may flow through the drain electrode, the channel region, and the source region. It is to be noted that in the specification, the channel region refers to a main region that a current flows through.

In the specification, a first electrode may be the drain electrode, and a second electrode may be the source electrode. Alternatively, the first electrode may be a source electrode, and the second electrode may be a drain electrode. In cases that transistors with opposite polarities are used, or a current direction changes during work of a circuit, or the like, functions of the "source electrode" and the "drain electrode" may sometimes be exchangeable. Therefore, the "source electrode" and the "drain electrode", as well as the "source terminal" and the "drain terminal", are interchangeable in the specification.

In the specification, "electric connection" includes connection of the composition elements through an element with a certain electric action. "An element with a certain electric action" is not particularly limited as long as electric signals between the connected composition elements may be sent and received. Examples of "an element with a certain electric action" not only include an electrode and a line, but also include a switch element such as a transistor, a resistor, an inductor, a capacitor, another element with various functions, etc.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

In the specification, a "film" and a "layer" are interchangeable. For example, a "conductive layer" may be replaced with a "conductive film" sometimes. Similarly, an "insulation film" may be replaced with an "insulation layer" sometimes.

Triangle, rectangle, trapezoid, pentagon, hexagon, etc. in this specification are not strictly defined, and they may be approximate triangle, rectangle, trapezoid, pentagon, hexagon, etc. There may be some small deformations caused by tolerance, and there may be chamfer, arc edge, deformation, etc.

In the present disclosure, "about" refers to that a boundary is not defined so strictly and numerical values within process and measurement error ranges are allowed.

FIG. 1 is a schematic diagram of a structure of a display apparatus. As shown in FIG. 1, the display apparatus may include a timing controller, a data driver, a scan driver, a light emitting driver, and a pixel array. The timing controller is connected with the data driver, the scan driver, and the light emitting driver, respectively, the data driver is connected with a plurality of data signal lines (D1 to Dn) respectively, the scan driver is connected with a plurality of scan signal lines (S1 to Sm) respectively, and the light emitting driver is connected with a plurality of light emitting signal lines (E1 to Eo) respectively. The pixel array may include a plurality of sub-pixels Pxij, wherein i and j may be natural numbers. At least one sub-pixel Pxij may include a circuit unit and a light emitting device connected with the circuit unit, wherein the circuit unit may include a pixel drive circuit which is connected with a scan signal line, a data signal line, and a light emitting signal line, respectively. In an exemplary implementation, the timing controller may provide a grayscale value and a control signal suitable for the specification of the data signal driver to the data signal driver, may provide a clock signal, a scan start signal, etc. suitable for the specification of the scan driver to the scan driver, and may provide a clock signal, an emission stop signal, etc. suitable for the specification of the light emitting driver to the light emitting driver. The data driver may generate data voltages to be provided to the data signal lines D1, D2, D3, . . . , and Dn using the grayscale value and the control signal that are received from the timing controller. For example, the data driver may sample the grayscale value using the clock signal and apply a data voltage corresponding to the grayscale value to the data signal lines D1 to Dn by taking a row of pixels as a unit, wherein n may be a natural number. The scan driver may generate a scan signals to be provided to the scan signal lines S1, S2, S3, . . . , and Sm by receiving the clock signal and the scan start signal from the timing controller. For example, the scan driver may sequentially provide a scan signal with an on-level pulse to the scan signal lines S1 to Sm. For example, the scan driver may be constructed in a form of a shift register and generate a scan signal in a manner of sequentially transmitting a scan start signal provided in a form of an on-level pulse to a next-stage circuit under control of the clock signal, wherein m may be a natural number. The light emitting driver may receive a clock signal, an emission stop signal, etc., from the timing controller to generate an emission signal to be provided to the light emitting signal lines E1, E2, E3, . . . , and Eo. For example, the light emitting driver may sequentially provide an emission signal with an off-level pulse to the light emitting signal lines E1 to Eo. For example, the light emitting driver may be constructed in a form of a shift register and generate an emission signal in a manner of sequentially transmitting an emission stop signal provided in a form of an off-level pulse to a next-stage circuit under control of the clock signal, wherein o may be a natural number.

Figure 2:
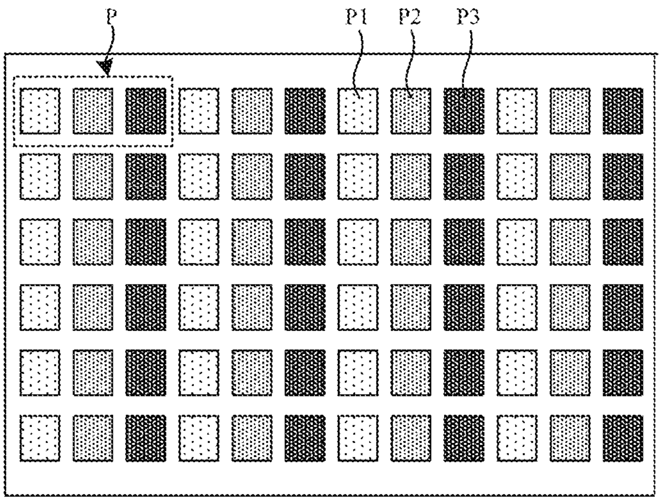
FIG. 2 is a schematic diagram of a planar structure of a display substrate.

FIG. 2 is a schematic diagram of a planar structure of a display substrate. In an exemplary implementation, the display substrate may include a plurality of pixel units P arranged in a matrix manner, and at least one pixel unit P may include a first sub-pixel P1 emitting a first color light, a second sub-pixel P2 emitting a second color light, and a third sub-pixel P3 emitting a third color light. Each of the three sub-pixels may include a circuit unit and a light emitting device, wherein the circuit unit may include a pixel drive circuit, which is respectively connected to the scan signal line, the data signal line, and the light emitting signal line, and is configured to receive a data voltage transmitted by the data signal line and output a corresponding current to the light emitting device under the control of the scan signal line and the light emitting signal line. The light emitting device in each sub-pixel is connected with a pixel drive circuit of a sub-pixel where the light emitting device is located, and is configured to emit light with corresponding brightness in response to a current output by the pixel drive circuit of the sub-pixel where the light emitting device is located.

In an exemplary implementation, the first sub-pixel P1 may be a red (R) sub-pixel emitting red light, the second sub-pixel P2 may be a blue (B) sub-pixel emitting blue light, and the third sub-pixel P3 may be a green (G) sub-pixel emitting green light. In an exemplary implementation, a sub-pixel may be in a shape of a rectangle, a rhombus, a pentagon, or a hexagon. Three sub-pixels may be provided side by side horizontally, side by side vertically, or in a manner like a Chinese character "品".

In another exemplary implementation, the pixel unit P may include four sub-pixels, which may be arranged side by side horizontally, side by side vertically, in a diamond shape or in a square, which is not limited there in the present disclosure.

Figure 3:
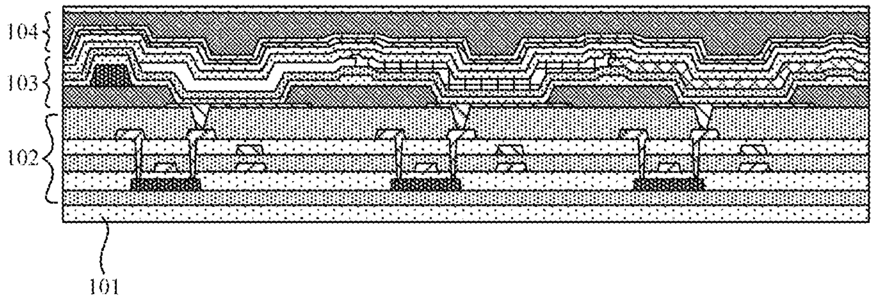
FIG. 3 is a schematic diagram of a sectional structure of a display substrate.

FIG. 3 is a schematic diagram of a sectional structure of a display substrate, and illustrates a structure of three sub-pixels of the display substrate. As shown in FIG. 3, on a plane perpendicular to the display substrate, the display substrate may include a drive circuit layer 102 arranged on a base substrate 101, a light emitting structure layer 103 arranged on a side of the drive circuit layer 102 away from the base substrate, and an encapsulation layer 104 arranged on a side of the light emitting structure layer 103 away from the base substrate. In some possible implementations, the display substrate may include another film layer, such as a post spacer, which is not limited in the present disclosure.

In an exemplary implementation, the base substrate 101 may be a flexible base substrate, or may be a rigid base substrate. The drive circuit layer 102 of each sub-pixel may include a plurality of circuit units which may include a pixel drive circuit formed by a plurality of transistors and a storage capacitor, and FIG. 3 is only illustrated by taking that the pixel drive circuit includes one drive transistor and one storage capacitor as an example. The light emitting structure layer 103 of each sub-pixel may include a plurality of light emitting units, and the emitting unit may include an anode, a pixel definition layer, an organic emitting layer, and a cathode, wherein the anode is connected with a drain electrode of a drive transistor through a via hole, the organic emitting layer is connected with the anode, the cathode is connected with the organic emitting layer, and the organic emitting layer emits light of corresponding color under drive of the anode and the cathode. The encapsulation structure layer 104 may include a first encapsulation layer, a second encapsulation layer, and a third encapsulation layer that are stacked. The first encapsulation layer and the third encapsulation layer may be made of inorganic materials, and the second encapsulation layer may be made of an organic material. The second encapsulation layer is arranged between the first encapsulation layer and the third encapsulation layer, which may ensure that external water vapor cannot enter the light emitting structure layer 103.

In an exemplary implementation, the organic emitting layer may include an Emitting Layer (EML) and any one or more of a Hole Injection Layer (HIL), a Hole Transport Layer (HTL), an Electron Block Layer (EBL), a Hole Block Layer (HBL), an Electron Transport Layer (ETL), and an Electron Injection Layer (EIL). In an exemplary implementation, hole injection layers, electron injection layers, hole transport layers, electron transport layers, hole block layers and electron block layers of all light emitting units may be connected together to form a common layer. Emitting layers of adjacent light emitting units may be overlapped slightly, or may be isolated.

Figure 4:
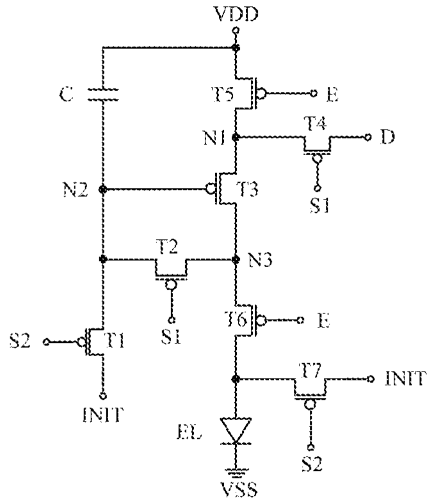
FIG. 4 is a schematic diagram of an equivalent circuit of a pixel drive circuit.

FIG. 4 is a schematic diagram of an equivalent circuit of a pixel drive circuit. In an exemplary implementation, the pixel drive circuit may have a structure of 3TIC, 4TIC, 5T1C, 5T2C, 6TIC, 7T1C, or 8TIC. As shown in FIG. 4, the pixel drive circuit may include seven transistors (a first transistor T1 to a seventh transistor T7), one storage capacitor C. The pixel drive circuit is connected with seven signal lines (a data signal line D, a first scan signal line S1, a second scan signal line S2, a light emitting signal line E, an initial signal line INIT, a first power supply line VDD, and a second power supply line VSS) respectively.

In an exemplary implementation, the pixel drive circuit may include a first node N1, a second node N2, and a third node N3. The first node N1 is connected to a first electrode of the third transistor T3, a second electrode of the fourth transistor T4 and a second electrode of the fifth transistor T5 respectively. The second node N2 is connected to a second electrode of the first transistor, a first electrode of the second transistor T2, a control electrode of the third transistor T3 and a second end of the storage capacitor C respectively. The third node N3 is connected to a second electrode of the second transistor T2, a second electrode of the third transistor T3 and a first electrode of the sixth transistor T6 respectively.

In an exemplary implementation, a first end of the storage capacitor C is connected with the first power supply line VDD, and the second end of the storage capacitor C is connected with the second node N2, i.e., the second end of the storage capacitor C is connected with the control electrode of the third transistor T3.

In an exemplary implementation, a control electrode of the first transistor T1 is connected to a second scan signal line S2, a first electrode of the first transistor T1 is connected to an initial signal line INIT, and a second electrode of the first transistor is connected to a second node N2. When a scan signal with an on-level is applied to the second scan signal line S2, the first transistor T1 transmits an initialization voltage to the control electrode of the third transistor T3 so as to initialize a charge amount of the control electrode of the third transistor T3.

In an exemplary implementation, a control electrode of the second transistor T2 is connected with the first scan signal line S1, a first electrode of the second transistor T2 is connected with the second node N2, and a second electrode of the second transistor T2 is connected with a third node N3. When a scan signal with an on-level is applied to the first scan signal line S1, the second transistor T2 enables the control electrode of the third transistor T3 to be connected to the second electrode of the third transistor T3.

In an exemplary implementation, the control electrode of the third transistor T3 is connected with the second node N2, namely the control electrode of the third transistor T3 is connected with the second end of the storage capacitor C, the first electrode of the third transistor T3 is connected with the first node N1, and the second electrode of the third transistor T3 is connected with the third node N3. The third transistor T3 may be referred to as a drive transistor, and the third transistor T3 determines an amount of a drive current flowing between the first power supply line VDD and the second power supply line VSS according to a potential difference between the control electrode and the first electrode of the third transistor T3.

In an exemplary implementation, a control electrode of the fourth transistor T4 is connected with the first scan signal line S1, a first electrode of the fourth transistor T4 is connected with the data signal line D, and a second electrode of the fourth transistor T4 is connected with the first node N1. The fourth transistor T4, may be referred to as a switching transistor, a scan transistor, etc., and the fourth transistor T4 enables a data voltage of the data signal line D to be input into the pixel drive circuit when a scan signal with an on-level is applied to the first scan signal line S1.

In an exemplary implementation, a control electrode of the fifth transistor T5 is connected with the light emitting signal line E, a first electrode of the fifth transistor T5 is connected with the first power supply line VDD, and the second electrode of the fifth transistor T5 is connected with the first node N1. The control electrode of the sixth transistor T6 is connected with the light emitting signal line E, the first electrode of the sixth transistor T6 is connected with the third node N3, and the second electrode of the sixth transistor T6 is connected with the first electrode of the light emitting device EL. The fifth transistor T5 and the sixth transistor T6 may be referred to as light emitting transistors. When a light emitting signal with an on-level is applied to the light emitting signal line E, the fifth transistor T5 and the sixth transistor T6 enable the light emitting device to emit light by forming a drive current path between the first power supply line VDD and the second power supply line VSS.

In an exemplary implementation, a control electrode of the seventh transistor T7 is connected with the second scan signal line S2, a first electrode of the seventh transistor T7 is connected with the initial signal line INIT, and a second electrode of the seventh transistor T7 is connected with the first electrode of the light emitting device EL. When a scan signal with an on-level is applied to the second scan signal line S2, the seventh transistor T7 transmits an initial voltage to the first electrode of the light emitting device EL so as to initialize the quantity of charge accumulated in the first electrode of the light emitting device EL or release the quantity of charge accumulated in the first electrode of the light emitting device.

In an exemplary implementation, the light emitting device EL may be an OLED including a first electrode (anode), an organic light emitting layer, and a second electrode (cathode), which are stacked, or may be a QLED including a first electrode (anode), a quantum dot light emitting layer, and a second electrode (cathode), which are stacked.

In an exemplary implementation, a second electrode of the light emitting device is connected with a second power supply line VSS, the signal of which is a continuously supplied low-level signal, and the signal of the first power supply line VDD is a continuously supplied high-level signal.

In an exemplary implementation, the first transistor T1 to the seventh transistor T7 may be P-type transistors, or may be N-type transistors. Use of a same type of transistors in a pixel drive circuit may simplify a process flow, reduce a process difficulty of a display panel, and improve a product yield. In some possible implementations, the first transistor T1 to the seventh transistor T7 may include a P-type transistor and an N-type transistor.

In an exemplary implementation, for the first transistor T1 to the seventh transistor T7, low temperature poly silicon thin film transistors may be adopted, or oxide thin film transistors may be adopted, or both a low temperature poly silicon thin film transistor and an oxide thin film transistor may be adopted. An active layer of a low temperature poly silicon thin film transistor may be made of Low Temperature Poly Silicon (LTPS for short), and an active layer of an oxide thin film transistor may be made of an oxide semiconductor (Oxide). The low temperature poly-silicon thin film transistors have advantages such as high migration rate and fast charging, and the oxide thin film transistors have advantages such as low leakage current. The low temperature poly-silicon thin film transistors and the oxide thin film transistors are integrated on one display substrate to form a low temperature polycrystalline oxide (LTPO) display substrate, so that the advantages of both the low temperature poly-silicon thin film transistors and the oxide thin film transistors can be utilized, low-frequency driving can be achieved, power consumption can be decreased, and display quality can be improved.

In an exemplary implementation, taking the seven transistors in the pixel drive circuit in FIG. 4 are all P-type transistors OLED as an example, the operation process of the pixel drive circuit may include following stages.

In a first stage A1, referred to as a reset stage, a signal of the second scan signal line S2 is a low-level signal, and signals of the first scan signal line S1 and the light emitting signal line E are high-level signals. The signal of the second scan signal line S2 is a low-level signal, the first transistor T1 and the seventh transistor T7 are turned on. The first transistor T1 is turned on such that an initial voltage signal of the initial signal line INIT is provided to a second node N2 to initialize the storage capacitor C to clear an original data voltage in the storage capacitor. The seventh transistor T7 is turned on, so that the initialization voltage signal of the initial signal line INIT is provided to a first electrode of the OLED to initialize (reset) the first electrode of the OLED and clear a pre-stored voltage therein, thereby completing initialization to ensure that the OLED does not emit light. The signals of the first scan signal line S1 and the light emitting signal line E are high-level signals, so that the second transistor T2, the fourth transistor T4, the fifth transistor T5 and the sixth transistor T6 are turned off. An OLED does not emit light in this stage.

In a second stage A2, referred to as a data writing stage or a threshold compensation stage, a signal of the first scan signal line S1 is a low-level signal, signals of the second scan signal line S2 and the light emitting signal line E are high-level signals, and the data signal line D outputs a data voltage. In this stage, the second end of the storage capacitor C is at a low level, so the third transistor T3 is turned on. The signal of the first scan signal line S1 is a low-level signal, so that the second transistor T2 and the fourth transistor T4 are turned on, which makes the data voltage output by the data signal line D be provided to the second node N2 through a first node N1, the turned-on third transistor T3, a third node N3, and the turned-on second transistor T2, and makes the storage capacitor C be charged with a difference between the data voltage output by the data signal line D and a threshold voltage of the third transistor T3. A voltage at the second terminal (the second node N2) of the storage capacitor C is $Vd-|Vth|$, wherein Vd is the data voltage output by the data signal line D, and Vth is the threshold voltage of the third transistor T3. The signal of the second scan signal line S2 is the high-level signal, so that the first transistor T1 and the seventh transistor T7 are turned off. The signal of the light emitting signal line E is a high-level signal, so that the fifth transistor T5 and the sixth transistor T6 are turned off.

In a third stage A3, referred to as a light emitting stage, a signal of the light emitting signal line E is a low-level signal, and signals of the first scan signal line S1 and the second scan signal line S2 are high-level signals. The signal of the light emitting signal line E is a low-level signal, so that the fifth transistor T5 and the sixth transistor T6 are turned on, and a power voltage output by the first power supply line VDD provides a drive voltage to the first electrode of the OLED through the turned-on fifth transistor T5, third transistor T3, and sixth transistor T6 to drive the OLED to emit light.

In a drive process of the pixel drive circuit, a drive current flowing through the third transistor T3 (drive transistor) is determined by a voltage difference between a gate electrode and a first electrode of the third transistor T3. The voltage of the second node N2 is Vdata−|Vth|, so the drive current of the third transistor T3 is as follows.

$$I = K*(Vgs - Vth)^2 = K*[(Vdd - Vd + |Vth|) - Vth]^2 = K*[(Vdd - Vd)]^2$$

Herein, I is the drive current flowing through the third transistor T3, i.e., a drive current for driving the OLED, K is a constant, Vgs is the voltage difference between the gate electrode and the first electrode of the third transistor T3, Vth is the threshold voltage of the third transistor T3, Vd is the data voltage output by the data signal line D, and Vdd is the power voltage output by the first power supply line VDD.

With the continuous development of display technology, OLED technology is more and more used in wearable and vehicle-mounted display apparatus. For wearable and vehicle-mounted display apparatus, it is usually required that the display apparatus have a certain transmittance to ensure the smooth operation of photosensitive devices.

An exemplary implementation of the present disclosure provides a display substrate. On a plane perpendicular to the display substrate, the display region may include a drive circuit layer arranged on the base substrate, a light emitting structure layer arranged at a side of the drive circuit layer away from the base substrate, and an encapsulation structure layer arranged at a side of the light emitting structure layer away from the base substrate. On a plane parallel to the display substrate, the drive circuit layer may include a plurality of circuit units, and the circuit units may at least include pixel drive circuits configured to output corresponding currents under the control of corresponding signal lines. The light emitting structure layer may include a plurality of light emitting units, and the light emitting units are connected to pixel drive circuits of the corresponding circuit units, and are configured to emit light of corresponding brightness in response to currents output by the connected pixel drive circuits.

In an exemplary implementation, the circuit units mentioned in the present disclosure refer to regions divided according to pixel drive circuits, and light emitting units mentioned in the present disclosure refer to regions divided according to light emitting devices. In an exemplary implementation, a position and shape of an orthographic projection of a light emitting unit on the base substrate may correspond to a position and shape of an orthographic projection of a circuit unit on the base substrate, or the position and shape of the orthographic projection of the light emitting unit on the base substrate may not correspond to the position and shape of the orthographic projection of the circuit unit on the base substrate.

Figure 5A:
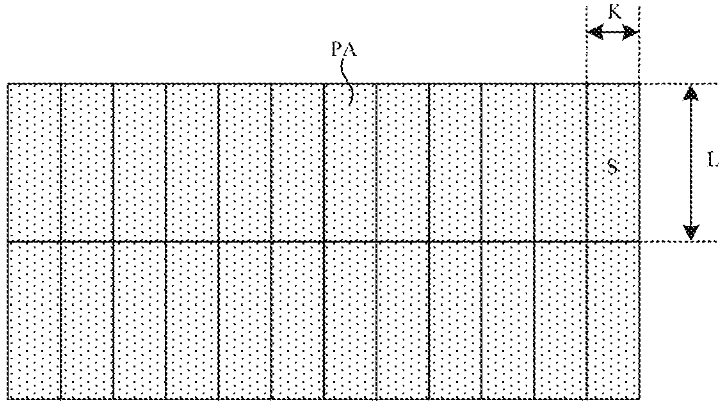
FIG. 5A is a schematic diagram of an arrangement of circuit units according to an exemplary embodiment of the present disclosure.

FIG. 5A is a schematic diagram of an arrangement of circuit units according to an exemplary embodiment of the present disclosure. As shown in FIG. 5A, in an exemplary implementation, on a plane parallel to the display substrate, the drive circuit layer of the display region may include a plurality of circuit units PA, the plurality of circuit units PA may form a plurality of unit rows and a plurality of unit columns, wherein the unit rows may include a plurality of circuit units PA sequentially arranged along a first direction X, the unit columns may include a plurality of circuit units PA sequentially arranged along a second direction Y, and the first direction X intersects with the second direction Y.

In an exemplary implementation, a shape of the circuit unit PA may be a rectangular shape, a long side of the circuit unit PA in a rectangular shape may extend along the second direction Y (column direction), and a short side of the circuit unit PA in a rectangular shape may extend along the first direction X (row direction), forming an arrangement of horizontal parallel units.

In an exemplary implementation, the circuit unit PA may at least include a pixel drive circuit which is connected with a scan signal line, a data signal line, and a light emitting signal line respectively, and the pixel drive circuit is configured to receive a data voltage transmitted by the data signal line and output a corresponding current to the connected light emitting device under control of the scan signal line and the light emitting signal line.

In an exemplary implementation, the rectangular circuit unit PA may have a unit length L, a unit width K and a unit area S, wherein the unit length L is a dimension of the circuit unit PA in the second direction Y, the unit width K is a dimension of the circuit unit PA in the first direction X, and the unit area S is an area of an orthographic projection of the circuit unit PA on the plane of the display substrate.

Figure 5B:
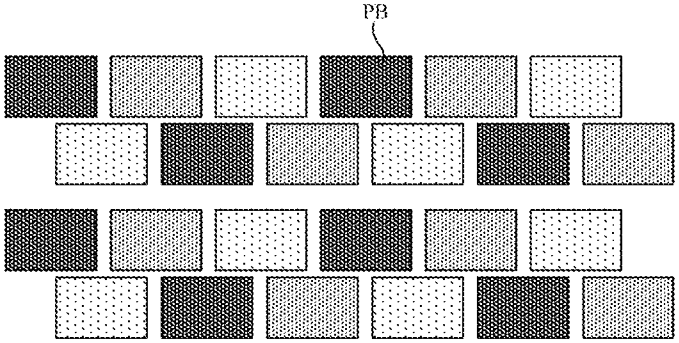
FIG. 5B is a schematic diagram of an arrangement of light emitting units according to an exemplary embodiment of the present disclosure.

FIG. 5B is a schematic diagram of an arrangement of light emitting units according to an exemplary embodiment of the present disclosure. As shown in FIG. 5B, in an exemplary implementation, on a plane parallel to the display substrate, the light emitting structure layer of the display substrate may include a plurality of light emitting units PB arranged regularly, and the plurality of light emitting units PB may form a plurality of pixel rows and a plurality of pixel columns, wherein the pixel rows may include a plurality of light emitting units PB sequentially arranged along the first direction X, and the pixel columns may include a plurality of light emitting units PB sequentially arranged along the second direction Y.

In an exemplary implementation, the plurality of light emitting units PB may include red R light emitting units emitting red light, blue light emitting units B emitting blue light and green G light emitting units emitting green light, wherein the red light emitting units, the blue light emitting units and the green light emitting units in each pixel row may be arranged periodically in the first direction X, the red light emitting units, the blue light emitting units and the green light emitting units in the odd-numbered pixel rows and the even-numbered pixel rows are dislocated, and the six light emitting units form a Delta pixel arrangement, the Delta pixel arrangement has an advantage of a large pixel aperture ratio.

In an exemplary implementation, the light emitting unit PB may include a light emitting device, the light emitting device in the light emitting unit PB is connected to a pixel drive circuit of a corresponding circuit unit, and the light emitting device is configured to emit light of a corresponding brightness in response to a current output by the connected pixel drive circuit.

In an exemplary implementation, a shape of the light emitting unit PB may include any one or more of the following: a triangle, a rectangle, a diamond, a pentagon, and a hexagon.

An exemplary embodiment of the present disclosure provides a display substrate including a drive circuit layer arranged on a base substrate and a light emitting structure layer arranged on a side of the drive circuit layer away from the base substrate, wherein the drive circuit layer includes a plurality of circuit units forming a plurality of unit rows and a plurality of unit columns, and the light emitting structure layer includes a plurality of light emitting units forming a plurality of pixel rows and a plurality of pixel columns; the circuit unit includes at least a pixel drive circuit, the light emitting unit includes at least one anode, and an anode of at least one light emitting unit is connected to a pixel drive circuit of a corresponding circuit unit; at least one circuit unit is provided with at least one light transmitting region located between adjacent anodes; there is a first dimension between two adjacent anodes in two adjacent pixel rows, and the light transmitting region has a second dimension, wherein a ratio of the second dimension to the first dimension is greater than or equal to 0.5, the first dimension is a minimum distance between edges of two adjacent anodes, and the second dimension is a maximum distance between edges of the light transmitting region.

In an exemplary implementation, the pixel drive circuit at least includes a storage capacitor, a first transistor, a second transistor, a third transistor, and a fourth transistor; in a circuit unit of at least one circuit row, a first electrode of the first transistor is connected to an initial signal line, a second electrode of the second transistor is connected to a second electrode of the third transistor, a first electrode of the third transistor is connected to a second electrode of the fourth transistor, and a first electrode of the fourth transistor is connected to a data signal line; the second transistor of at least one circuit unit of an M-th circuit row is arranged on a side of the storage capacitance close to an (M+1)-th circuit row, the first transistor of the at least one circuit unit of the M-th circuit row is arranged on a side of the storage capacitance away from the (M+1)-th circuit row, a first electrode of the second transistor of the at least one circuit unit of the M-th circuit row and a second electrode of the first transistor of the at least one circuit unit of the (M+1)-th circuit row are of an integral structure connected with each other, wherein M is a positive integer greater than or equal to 1.

Figure 6A:
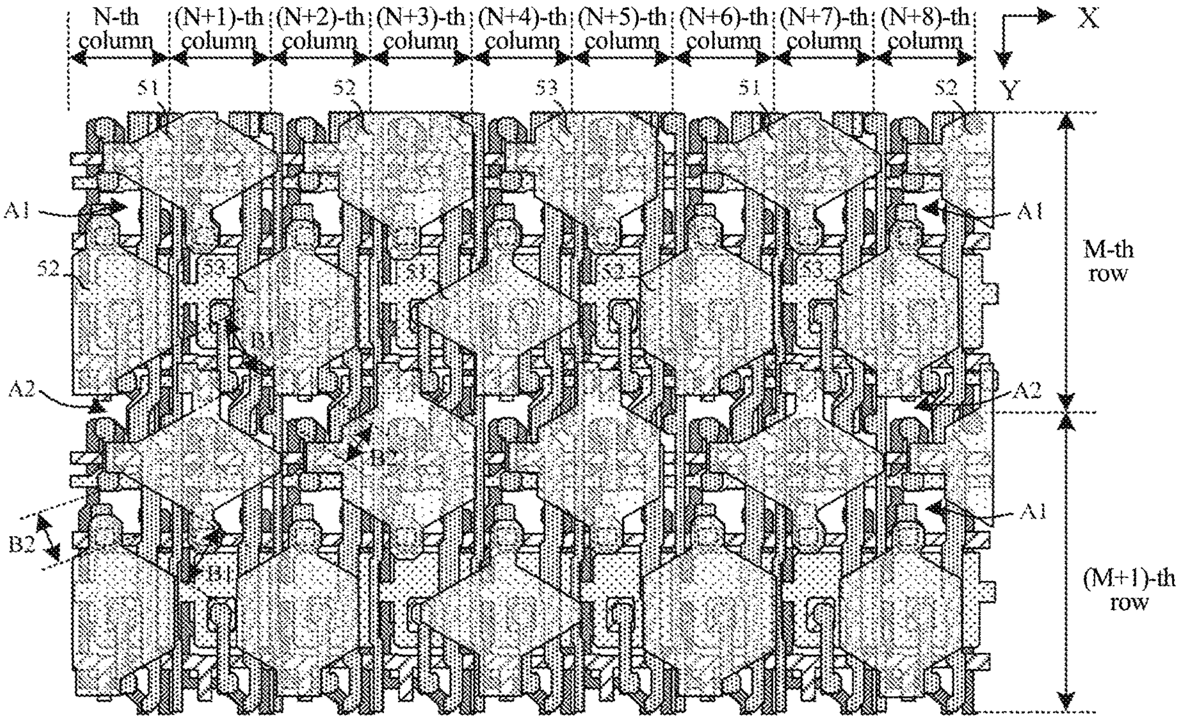
FIG. 6A is a schematic diagram of a structure of a display substrate according to an exemplary embodiment of the present disclosure.

FIG. 6A is a schematic diagram of a structure of a display substrate according to an exemplary implementation of the present disclosure. As shown in FIG. 6A, a plurality of light emitting units of the light emitting structure layer may include a first light emitting unit emitting a first color light, a second light emitting unit emitting a second color light, and a third light emitting unit emitting a third color light, wherein the first light emitting unit may at least include a first anode 51, the second light emitting unit may at least include a second anode 52, and the third light emitting unit may at least include a third anode 53. The first anode 51, the second anode 52, and the third anode 53 may be periodically arranged along a first direction X (pixel row direction), the first anode 51, the second anode 52, and the third anode 53 of adjacent pixel rows are dislocated, and a plurality of first anodes 51, a plurality of second anodes 52, and a plurality of third anodes 53 in odd-numbered pixel rows and adjacent even-numbered pixel rows may be correspondingly connected to pixel drive circuits of a plurality of circuit units of the same unit row. For example, in FIG. 6A, a plurality of anodes of the first anode row (an odd-numbered pixel row) and a plurality of anodes of the second anode row (an even-numbered pixel row) are all correspondingly connected to pixel drive circuits in circuit units of an M-th row. For another example, in FIG. 6A, a plurality of anodes of the third anode row (an odd-numbered pixel row) and a plurality of anodes of the fourth anode row (an even-numbered pixel row) are all correspondingly connected to pixel drive circuits in circuit units of an (M+1)-th row.

In an exemplary implementation, at least one circuit unit may be provided with at least one light transmitting region, which may be located between adjacent anodes in the second direction Y. The light transmission region may include a first light transmission region A1 and a second light transmission region A2, wherein the first light transmission region A1 may be located between an odd-numbered pixel row and an adjacent next even-numbered pixel row, and the second light transmission region A2 may be located between an even-numbered pixel row and an adjacent next odd-numbered pixel row.

In an exemplary implementation, the first light transmitting region A1 may be located between a first anode 51 of a first light emitting unit in an odd-numbered pixel row and a second anode 52 of a second light emitting unit in an adjacent next even-numbered pixel row, and the second light transmitting region A2 may be located on a side of the second anode 52 of the second light emitting unit away from the first light transmitting region A1.

In an exemplary implementation, the first light transmitting region A1 may be located between a second anode 52 of a second light emitting unit in an odd-numbered pixel row and a third anode 53 of a third light emitting unit in an adjacent next even-numbered pixel row, and the second light transmitting region A2 may be located on a side of the third anode 53 away from the first light transmitting region A1.

In an exemplary implementation, the first light transmitting region A1 may be located between a third anode 53 of a third light emitting unit in an odd-numbered pixel row and a first anode 51 of a first light emitting unit in an adjacent next even-numbered pixel row, and the second light transmitting region A2 may be located on a side of the first anode 51 away from the first light transmitting region A1.

In an exemplary implementation, an area of the first light transmitting region A1 may be larger than an area of the second light transmitting region A2.

In an exemplary implementation, the first light transmitting region A1 and the second light transmitting region A2 may transmit light, a transmittance of the first light transmitting region A1 may be greater than or equal to 60%, and a transmittance of the second light transmitting region A2 may be greater than or equal to 60%.

In an exemplary implementation, there may be a first dimension B1 between one anode in an odd-numbered pixel row and another anode in an adjacent next even-numbered pixel row, or there may be a first dimension B1 between one anode in an even-numbered pixel row and another anode in an adjacent next odd-numbered pixel row, the first light transmitting region A1 may have a second dimension B2, or the second light transmitting region A2 may have a second dimension B2, and a ratio of the second dimension B2 to the first dimension B1 may be greater than or equal to 0.5. Herein, the first dimension B1 may be a minimum distance between two adjacent anode edges, and the second dimension B2 may be a maximum distance between two edges of the first light transmitting region A1, or the second dimension B2 may be a maximum distance between two edges of the second light transmitting region A2.

In an exemplary implementation, the anode may include an anode body portion and an anode connection portion, wherein the anode body portion may be in a rhombus-like shape or a hexagonal-like shape, the anode connection portion may be in a strip shape and is configured to be connected to a corresponding pixel drive circuit through a via hole, and the second dimension B2 may be a minimum distance between edges of two adjacent anode body portions.

Figure 6B:
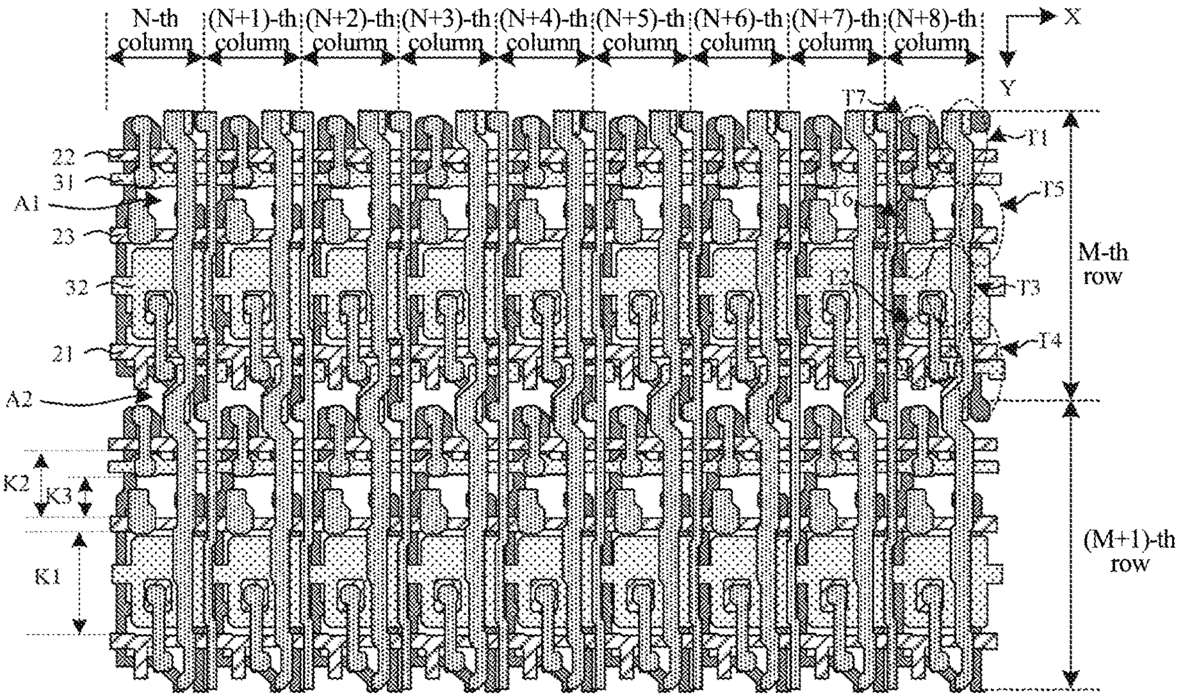
FIG. 6B is a schematic diagram of a structure of a drive circuit layer according to an exemplary embodiment of the present disclosure.

FIG. 6B is a schematic diagram of a structure of a drive circuit layer according to an exemplary implementation of the present disclosure, and illustrates a planar structure of 18 circuit units (2 unit rows and 9 unit columns). As shown in FIG. 6B, on a plane parallel to the display substrate, the drive circuit layer may include a plurality of circuit units forming a plurality of unit rows and a plurality of unit columns, wherein the unit rows include a plurality of circuit units sequentially arranged along a first direction X, the unit columns include a plurality of circuit units sequentially arranged along a second direction Y, the plurality of unit rows and the plurality of unit columns form an array of circuit units arranged in an array, and the first direction X intersects with the second direction Y.

In an exemplary implementation, at least one circuit unit may include a pixel drive circuit, which may at least include a storage capacitor and a plurality of transistors, and the plurality of transistors may at least include a first transistor T1 as a first initialization transistor, a second transistor T2 as a compensation transistor, a third transistor T3 as a drive transistor, and a fourth transistor T4 as a data write transistor. In a circuit unit of at least one circuit row, a first electrode of the first transistor T1 is connected to an initial signal line 31, a second electrode of the second transistor T2 is connected to a second electrode of the third transistor T3, a first electrode of the third transistor T3 is connected to a second electrode of the fourth transistor T4, and a first electrode of the fourth transistor T4 is connected to a data signal line 44.

In an exemplary implementation, in at least one circuit unit of an M-th circuit row, the first transistor T1 and the second transistor T2 may be arranged on both sides of the third transistor T3 in the second direction Y, the second transistor T2 may be arranged on a side of the third transistor T3 close to an (M+1)-th circuit row, and the first transistor T1 is arranged on a side of the third transistor T3 away from the (M+1)-th circuit row.

In an exemplary implementation, the first electrode of the second transistor T2 of at least one circuit unit of the M-th circuit row and the second electrode of the first transistor T1 of at least one circuit unit of the (M+1)-th circuit row may be of an integral structure connected to each other.

In an exemplary implementation, the at least one circuit unit may further include a first scan signal line 21 and a second scan signal line 22, wherein the first scan signal line 21 is connected to a gate electrode of the second transistor T2 and a gate electrode of the fourth transistor T4 and is configured to control the second transistor T2 and the fourth transistor T4 to be turned on or off, and the second scan signal line 22 is connected to a gate electrode of the first transistor T1 and is configured to control the first transistor T1 to be turned on or off. The first scan signal line 21 of at least one circuit unit of the M-th circuit row may be arranged on a side of the third transistor T3 close to the (M+1)-th circuit row, and the second scan signal line 22 of at least one circuit unit of the M-th circuit row may be arranged on a side of the third transistor T3 away from the (M+1)-th circuit row.

In an exemplary implementation, the pixel drive circuit may further include a fifth transistor T5 and a sixth transistor T6, wherein a first electrode of the fifth transistor T5 is connected to a first power supply line 45, a second electrode of the fifth transistor T5 is connected to a first electrode of the third transistor T3, a first electrode of the sixth transistor T6 is connected to a second electrode of the third transistor T3, and a second electrode of the sixth transistor T6 is connected to a light emitting device. At least one circuit unit may further include a light emitting control signal line 23, which is connected to a gate electrode of the fifth transistor T5 and a gate electrode of the sixth transistor T6. The light emitting control signal line 23 is configured to control the fifth transistor T5 and the sixth transistor T6 to be turned on and off, and may be arranged on a side of the second scan signal line 22 close to the third transistor T3.

In an exemplary implementation, in at least one circuit unit of at least one circuit row, there is a first pitch K1 between an edge of the first scan signal line 21 at a side close to the light emitting control signal line 23 and an edge of the light emitting control signal line 23 at a side close to the first scan signal line 21, and the first pitch K1 may be about 0.33*L to 0.37*L and may be a dimension in the second direction Y, wherein L is a unit length.

In an exemplary implementation, in at least one circuit unit of at least one circuit row, there is a second pitch K2 between an edge of the second scan signal line 22 at a side close to the light emitting control signal line 23 and an edge of the light emitting control signal line 23 at a side close to the second scan signal line 22, and the second pitch K2 may be about 0.20*L to 0.24*L and may be a dimension in the second direction Y.

In an exemplary implementation, the at least one circuit unit may further include an initial signal line 31, which is connected to the first electrode of the first transistor T1, and in at least one circuit unit of at least one circuit row, the initial signal line 31 may be arranged between the second scan signal line 22 and the light emitting control signal line 23.

In an exemplary implementation, in at least one circuit unit of at least one circuit row, there is a third pitch K3 between an edge of the initial signal line 31 at a side close to the light emitting control signal line 23 and an edge of the light emitting control signal line 23 at a side close to the initial signal line 31, and the third pitch K3 may be about 0.12*L to 0.16*L and may be a dimension in the second direction Y.

In an exemplary implementation, at least one circuit unit is formed with a first light transmitting region A1, wherein an area of an orthographic projection of the first light transmitting region A1 on the plane of the display substrate is greater than or equal to 0.02*S, and S is a unit area.

In an exemplary implementation, in the first direction X (unit row direction), the first light transmitting region A1 may be located between the second electrode of the sixth transistor T6 and the first power supply line 45, and in the second direction Y (unit column direction), the first light transmitting region A1 may be located between the initial signal line 31 and the light emitting control signal line 23.

In an exemplary implementation, at least one circuit unit is formed with the second light transmitting region A2, wherein an area of an orthographic projection of the second light transmitting region A2 on the plane of the display substrate is greater than or equal to 0.02*S.

In an exemplary implementation, in the first direction X (a direction of the unit row), the second light transmitting region A2 may be located between the data signal line 44 and the first power supply line 45, and in the second direction Y (a direction of the unit column), the second light transmitting region A2 may be located between the first scan signal line 21 of the circuit unit in the M-th circuit row and the second scan signal line 22 of the circuit unit in the (M+1)-th circuit row.

In an exemplary implementation, shapes of the first scan signal line 21, the second scan signal line 22, the light emitting control signal line 23, and the initial signal line 31 may be shapes of straight lines or bend lines in which the main body portions extend along the first direction X, and shapes of the data signal line 44 and the first power supply line 45 may be shapes of straight lines or bend lines in which the main body portions extend along the second direction Y.

In an exemplary implementation, A extends along B direction means that A may include a main portion and a secondary portion connected with the main portion, the main portion is a line, a line segment, or a strip-shaped body, the main portion extends along the B direction, and a length of the main portion extending along the B direction is greater than a length of the secondary portion extending along another direction.

In an exemplary implementation, on a plane perpendicular to the display substrate, the drive circuit layer may include a first insulation layer, a semiconductor layer, a second insulation layer, a first conductive layer, a third insulation layer, a second conductive layer, a fourth insulation layer, and a third conductive layer arranged along a direction away from the base substrate.

In an exemplary implementation, the storage capacitor may include a first electrode plate and a second electrode plate, an orthographic projection of the first electrode plate on the plane of the display substrate is at least partially overlapped with an orthographic projection of the second electrode plate on the plane of the display substrate.

Exemplary description is made below through a preparation process for a display substrate. A "patterning process" mentioned in the present disclosure includes photoresist coating, mask exposure, development, etching, photoresist stripping, etc., for a metal material, an inorganic material, or a transparent conductive material, and includes organic material coating, mask exposure, development, etc., for an organic material. Deposition may be any one or more of sputtering, evaporation and chemical vapor deposition, the coating may be any one or more of spray coating, spin coating and inkjet printing, and the etching may be any one or more of dry etching and wet etching, the present disclosure is not limited thereto. A "thin film" refers to a layer of thin film made of a certain material on a base substrate using deposition, coating, or other processes. If the "thin film" does not need to be processed through a patterning process in the entire manufacturing process, the "thin film" may also be called a "layer". If the "thin film" needs to be processed through the patterning process in the entire manufacturing process, the "thin film" is called a "thin film" before the patterning process is performed and is called a "layer" after the patterning process is performed. At least one "pattern" is contained in the "layer" which has been processed through the patterning process. "A and B are arranged in a same layer" in the present disclosure means that A and B are formed simultaneously through a same patterning process, and a "thickness" of a film layer is a dimension of the film layer in a direction perpendicular to a display substrate. In an exemplary implementation of the present disclosure, "an orthographic projection of B being within a range of an orthographic projection of A" or "an orthographic projection of A containing an orthographic projection of B" means that a boundary of the orthographic projection of B falls within a range of a boundary of the orthographic projection of A, or the boundary of the orthographic projection of A is overlapped with the boundary of the orthographic projection of B.

In an exemplary implementation, the preparation for the display substrate may at least include preparing a drive circuit layer and preparing a light emitting structure layer.

In an exemplary implementation, taking 18 circuit units (2 unit rows and 9 unit columns) as an example, the preparation process of the drive circuit layer may include the following acts.

Figure 7:
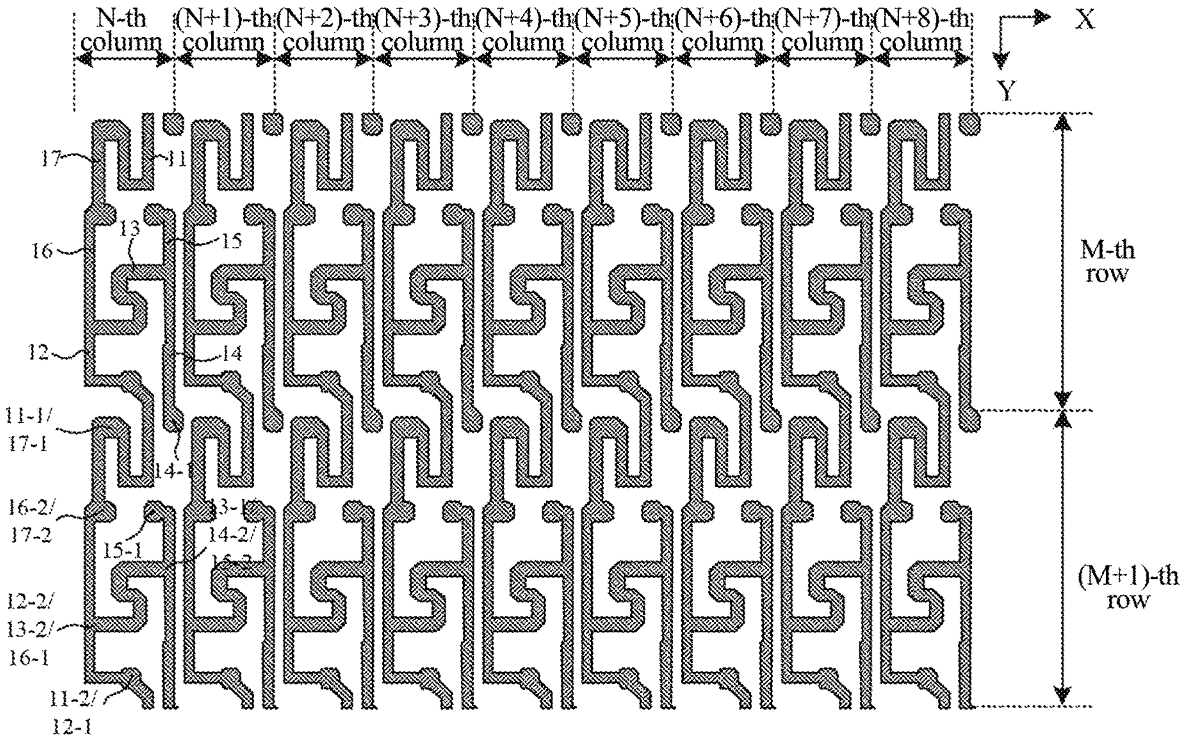
FIG. 7 is a schematic diagram obtained after a pattern of a semiconductor layer is formed according to an embodiment of the present disclosure.

(1) A pattern of a semiconductor layer is formed. In an exemplary implementation, forming a pattern of a semiconductor layer may include: depositing sequentially a first insulation thin film and a semiconductor thin film on a base substrate, and patterning the semiconductor thin film through a patterning process to form a first insulation layer covering the base substrate and a semiconductor layer arranged on the first insulation layer, as shown in FIG. 7.

In an exemplary implementation, the semiconductor layer of each circuit unit may at least include a first active layer 11 of a first transistor T1 to a seventh active layer 17 of a seventh transistor T7. The first active layer 11 to the seventh active layer 17 are of an integral structure connected with each other, and in each unit column, a second active layer 12 of a circuit unit in a M-th row and a first active layer 11 of a circuit unit in a ((M+1))-th row are connected with each other, that is, the semiconductor layers of adjacent circuit units in each unit column are an of an integral structure connected with each other.

In an exemplary implementation, in the first direction X, the fourth active layer 14 and the fifth active layer 15 of the N-th column circuit unit may be located on a side of a third active layer 13 of the present circuit unit close to the (N+1)-th column circuit unit, and the second active layer 12 and the sixth active layer 16 may be located on a side of the third active layer 13 of the present circuit unit away from the (N+1)-th column circuit unit.

In an exemplary implementation, in the second direction Y, the first active layer 11, the fifth active layer 15, the sixth active layer 16 and the seventh active layer 17 in the M-th circuit unit row may be located on a side of the third active layer 13 of the present circuit unit away from the (M+1)-th circuit unit row, the first active layer 11 and the seventh active layer 17 may be located on a side of the fifth active layer 15 and the sixth active layer 16 away from the third active layer 13, and the second active layer 12 and the fourth active layer 14 in the M-th circuit unit row may be located on a side of the third active layer 13 close to the (M+1)-th circuit unit row.

In an exemplary implementation, the first active layer 11 may be in an "U" shape, the third active layer 13 may be in a "S" shape, the second active layer 12 may be in an "L" shape, the fourth active layer 14, the fifth active layer 15, the sixth active layer 16 and the seventh active layer 17 may be in an "I" shape.

In an exemplary implementation, an active layer of each transistor may include a first region, a second region, and a channel region located between the first region and the second region. In an exemplary implementation, in one circuit unit, a first region 11-1 of the first active layer 11 may serve as a first region 17-1 of the seventh active layer 17; a second region 11-2 of the first active layer 11 may serve as a first region 12-1 of the second active layer 12; a first region 13-1 of the third active layer 13 may serve as a second region 14-2 of the fourth active layer 14 and a second region 15-2 of the fifth active layer 15 simultaneously; a second region 13-2 of the third active layer 13 may serve as a second region 12-2 of the second active layer 12 and a first region 16-1 of the sixth active layer 16 simultaneously; a second region 16-2 of the sixth active layer 16 may serve as a second region 17-2 of the seventh active layer 17 simultaneously; a first region 14-1 of the fourth active layer 14 and a first region 15-1 of the fifth active layer 15 are separately provided.

In an exemplary implementation, the first region 12-1 of the second active layer 12 in the circuit unit in M-th circuit row and the second region 11-2 of the first active layer 11 in the circuit unit in (M+1)-th circuit row may be of an integral structure connected to each other. Because the first region 12-1 of the second active layer 12 serves as the first electrode of the second transistor T2, and the second region 11-2 of the first active layer 11 serves as the second electrode of the first transistor T1, the first electrode of the second transistor T2 of the circuit unit in M-th circuit row and the second electrode of the first transistor T1 of the circuit unit in (M+1)-th circuit row are of an integral structure connected to each other.

Figure 8A:
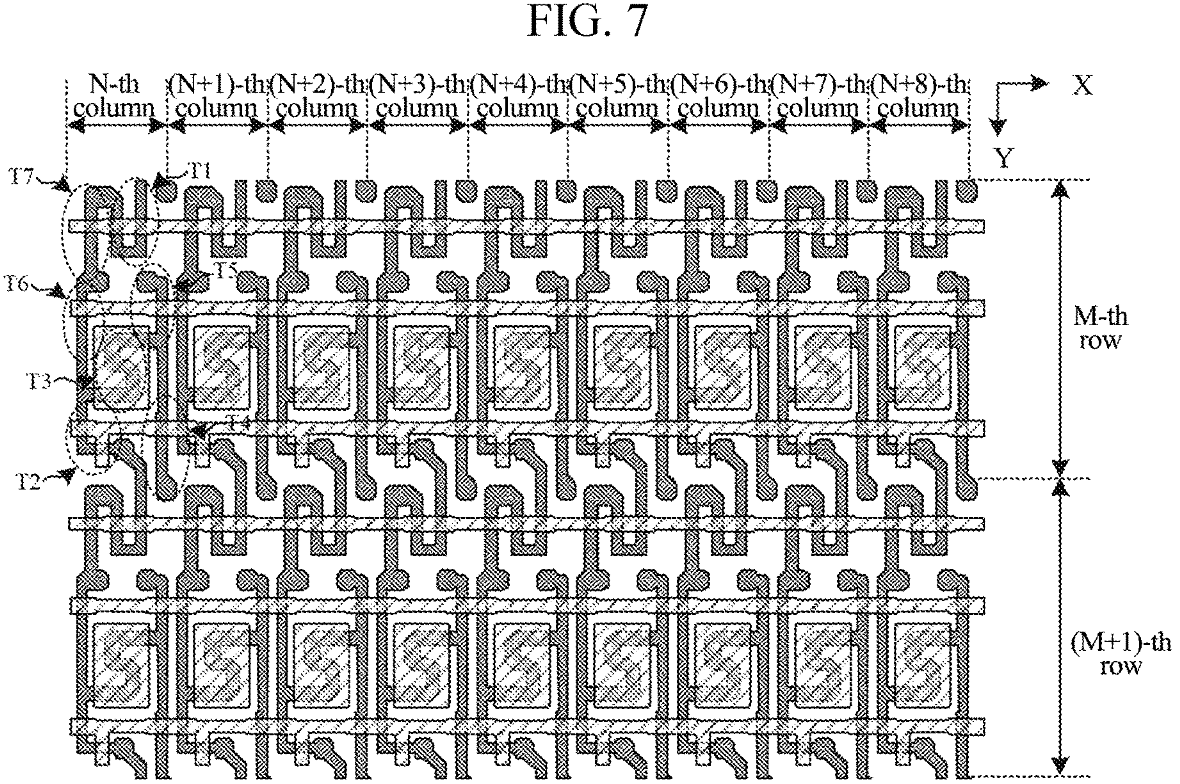
FIG. 8A and FIG. 8B are schematic diagrams obtained after a pattern of a first conductive layer is formed according to an embodiment of the present disclosure.
Figure 8B:
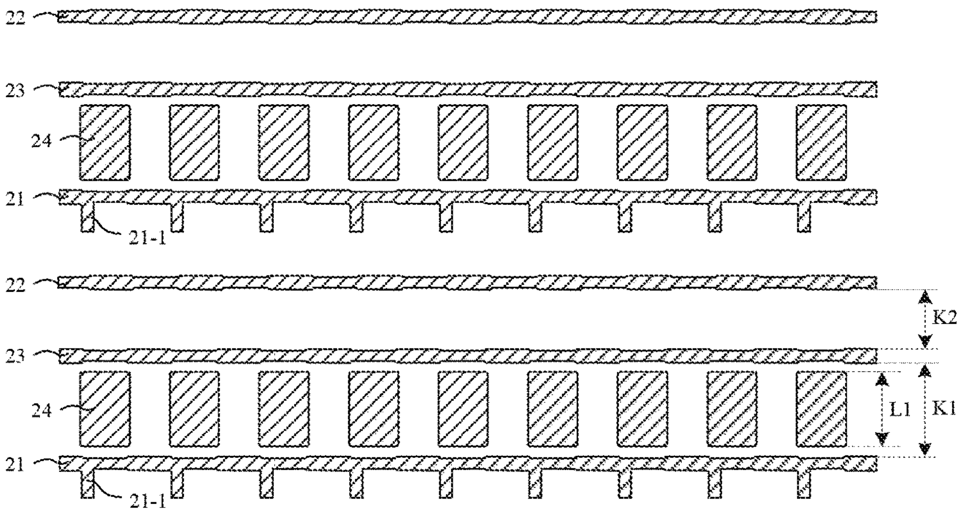

(2) A pattern of a first conductive layer is formed. In an exemplary implementation, forming the pattern of the first conductive layer may include: depositing sequentially a second insulation thin film and a first conductive thin film on the base substrate on which the aforementioned pattern is formed, and patterning the first conductive thin film through a patterning process to form a second insulation layer that covers a pattern of the semiconductor layer and form the pattern of the first conductive layer arranged on the second insulation layer, as shown in FIG. 8A and FIG. 8B, and FIG. 8B is a planar schematic diagram of the first conductive layer in FIG. 8A. In an exemplary implementation, the first conductive layer may be called a first gate metal (GATE1) layer.

In an exemplary implementation, the pattern of the first conductive layer of each circuit unit may at least include the first scan signal line 21, the second scan signal line 22, the light emitting control signal line 23, and the first electrode plate 24.

In an exemplary implementation, the first electrode plate 24 of the storage capacitor may be in a shape of a rectangle, and chamfers may be provided at corners of the rectangle. An orthographic projection of the first electrode plate 24 on the base substrate is at least partially overlapped with an orthographic projection of a third active layer of a third transistor T3 on the base substrate. In an exemplary implementation, the first electrode plate 24 may serve as an electrode plate of the storage capacitor and a gate electrode of the third transistor T3 simultaneously.

In an exemplary implementation, the first scan signal line 21, the second scan signal line 22, and the light emitting control signal line 23 may be in a line shape in which the main body portions extend along the first direction X. The first scan signal line 21 in the M-th row circuit unit may be located on a side of the first electrode plate 24 of the present circuit unit close to the (M+1)-th row circuit unit, the light emitting control signal line 23 may be located on a side of the first electrode plate 24 of the present circuit unit away from the (M+1)-th row circuit unit, and the second scan signal line 22 may be located on a side of the light emitting control signal line 23 away from the first electrode plate 24.

In an exemplary implementation, a gate block 21-1 is arranged on a side of the first scan signal line 21 away from the first electrode plate 24, a region in which the first scan signal line 21 and the gate block 21-1 are overlapped with the second active layer 12 serves as a gate electrode of the second transistor T2 with a double-gate structure, and a region in which the first scan signal line 21 is overlapped with the fourth active layer 14 serves as a gate electrode of the fourth transistor T4.

In an exemplary implementation, a region in which the second scan signal line 22 is overlapped with the first active layer 11 serves as a gate electrode of the first transistor T1 with a double-gate structure, a region in which the second scan signal line 22 is overlapped with the seventh active layer 17 serves as a gate electrode of the seventh transistor T7, a region in which the light emitting control signal line 23 is overlapped with the fifth active layer 15 serves as a gate electrode of the fifth transistor T5, and a region in which the light emitting control signal line 23 is overlapped with the sixth active layer 16 serves as a gate electrode of the sixth transistor T6.

In an exemplary implementation, shape of the first electrode plate 24 may be a rectangular shape, with long sides of the rectangular extending along the second direction Y and short sides of the rectangular extending along the first direction X, and the first electrode plate 24 has a first length L1, which may be a dimension of the first electrode plate 24 in the second direction Y.

In an exemplary implementation, the first length may be about 0.25*L to 0.30*L. For example, the first length L1 may be about 0.28*L.

In an exemplary implementation, there may be a first pitch K1 between an edge of the first scan signal line 21 at a side close to the first electrode plate 24 and an edge of the light emitting control signal line 23 at a side close to the first electrode plate 24, and the first pitch K1 may be about 0.33*L to 0.37*L. For example, the first pitch K1 may be about 0.35*L.

In an exemplary implementation, there may be a second pitch K2 between an edge of the second scan signal line 22 at a side close to the light emitting control signal line 23 and an edge of the light emitting control signal line 23 at a side close to the second scan signal line 22, and the second pitch K2 may be about 0.20*L to 0.24*L. For example, the second pitch K2 may be about 0.22*L.

In an exemplary implementation, for a circuit unit having a unit length L of about 78 μm, the first length L1 may be about 21.84 μm, the first pitch K1 may be about 27.7 μm, and the second pitch K2 may be about 17.4 μm.

In an exemplary implementation, after the pattern of the first conductive layer is formed, a conductive processing may be performed on the semiconductor layer by using the first conductive layer as a shield, a region of the semiconductor layer shielded by the first conductive layer forms channel regions of the first transistor T1 to the seventh transistor T7, and a region of the semiconductor layer not shielded by the first conductive layer is made to be conductive, that is, first regions and second regions of the first active layer to the seventh active layer are all made to be conductive.

Figure 9A:
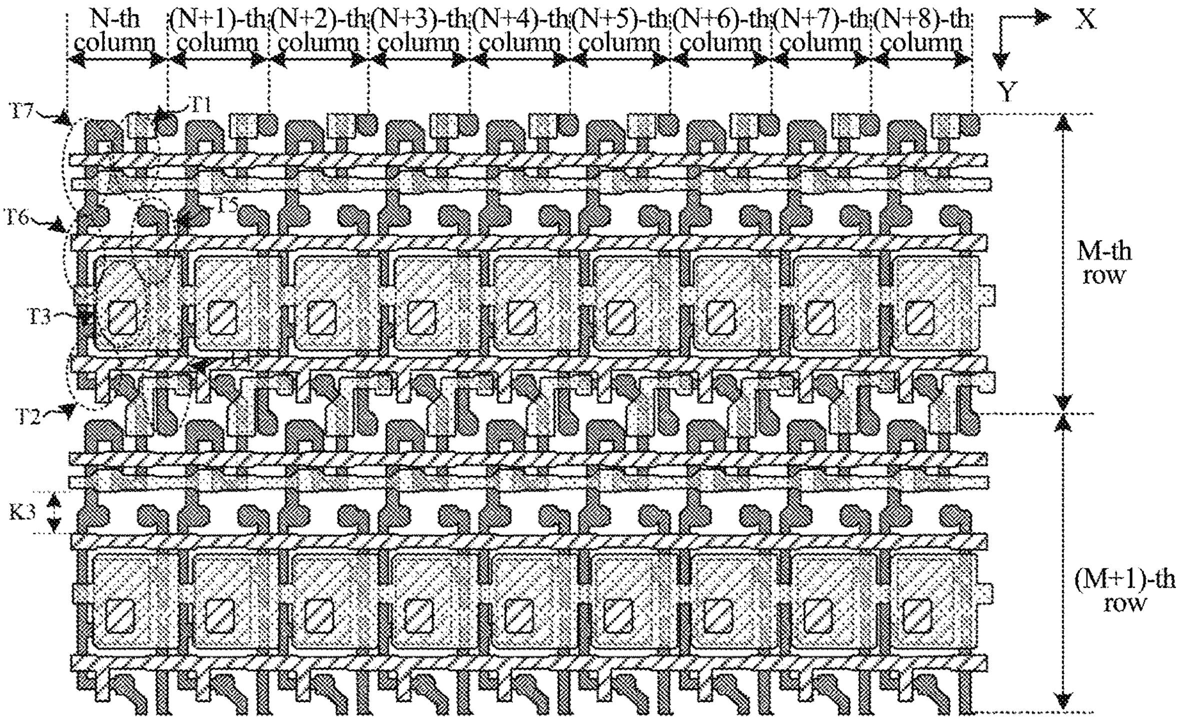
FIG. 9A and FIG. 9B are schematic diagrams obtained after a pattern of a second conductive layer is formed in accordance with an embodiment of the present disclosure.
Figure 9B:
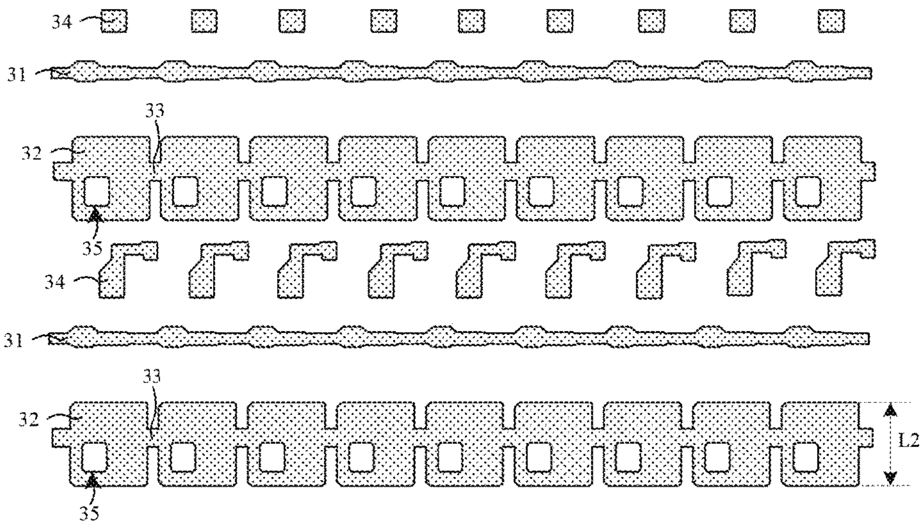

(3) A pattern of a second conductive layer is formed. In an exemplary implementation, forming a pattern of a second conductive layer may include: a third insulation thin film and a second conductive thin film are sequentially deposited on the base substrate on which the aforementioned patterns are formed, and the second conductive thin film is patterned through a patterning process to form a third insulation layer that covers the first conductive layer and the pattern of the second conductive layer arranged on the third insulation layer, as shown in FIG. 9A and FIG. 9B. FIG. 9B is a schematic plan view of the second conductive layer in FIG. 9A. In an exemplary implementation, the second conductive layer may be called a second gate metal (GATE 2) layer.

In an exemplary implementation, the pattern of second conductive layer of each circuit unit may at least includes an initial signal line 31, a second electrode plate 32, an electrode plate connection line 33, and a shielding electrode 34.

In an exemplary implementation, a shape of the initial signal line 31 may be a line shape in which the main body portion extends along the first direction X, the initial signal line 31 in the M-th row circuit unit may be located between the second scan signal line 22 and the light emitting control signal line 23, and the initial signal line 31 is configured to supply an initial voltage signal to the first transistor T1 and the seventh transistor T7.

In an exemplary implementation, an outline of the second electrode plate 32 of the storage capacitor may be in a shape of a rectangle, corners of which may be provided with chamfers. An orthographic projection of the second electrode plate 32 on the base substrate is at least partially overlapped with an orthographic projection of the first electrode plate 24 on the base substrate, and the first electrode plate 24 and the second electrode plate 32 form the storage capacitor of the pixel drive circuit.

In an exemplary implementation, the electrode plate connection line 33 may be arranged on a side of the second electrode plate 32 in the first direction X or on a side of the second electrode plate 32 in an opposite direction of the first direction X, a first end of the electrode plate connection line 33 is connected with the second electrode plate 32 of the present circuit unit, and a second end of the electrode plate connection line 33 is connected with a second electrode plate 32 of an adjacent circuit unit in the circuit row after extending along the first direction X or the opposite direction of the first direction X, so that second electrode plates 32 of adjacent circuit units on a unit row are connected with each other through electrode plate connection line 33. In an exemplary implementation, the second electrode plate 32 is connected to a first voltage line formed sequentially, the electrode plate connection line 33 enables second electrode plates of a plurality of circuit units in a unit row to form an integral structure connected with each other, and the second electrode plates with the integral structure may be multiplexed as a power supply signal line, which ensures that a plurality of second electrode plates in a unit row have a same potential, which is beneficial to improve uniformity of a panel, avoiding display defect of the display substrate and ensuring a display effect of the display substrate.

In an exemplary implementation, an opening 35 is arranged on the second electrode plate 32 and may be located in a middle part of the second electrode plate 32, and a shape of the opening 35 may be a rectangular shape, so that the second electrode plate 32 forms an annular structure. The opening 35 exposes the third insulation layer covering the first electrode plate 24, and an orthographic projection of the first electrode plate 24 on the base substrate contains an orthographic projection of the opening 35 on the base substrate. In an exemplary implementation, the opening 35 is configured to accommodate a first via hole formed subsequently, and the first via hole is located in the opening 35 and exposes the first electrode plate 24, so that a second electrode of the first transistor T1 formed subsequently is connected with the first electrode plate 24.

In an exemplary implementation, the shielding electrode 34 may be located at a side of the first scan signal line 21 of the present circuit unit away from the second electrode plate 32, the shielding electrode 34 may be in an "L" shape. An orthographic projection of the shielding electrode 34 on the base substrate is at least partially overlapped with an orthographic projection of the second region of the first active layer on the base substrate, the orthographic projection of the shielding electrode 34 on the base substrate is at least partially overlapped with an orthographic projection of the first region of the second active layer on the base substrate, and the shielding electrode 34 is configured to shield an influence of the data voltage jump on a key node, prevent from influence on a potential of the key node of the pixel drive circuit because of the data voltage jump, and improve a display effect.

In an exemplary implementation, a shape of the second electrode plate 32 may be a rectangular shape, with long sides of the rectangular extending along the second direction Y and short sides of the rectangular extending along the first direction X, and the second electrode plate 32 has a second length L2, which may be a dimension of the second electrode plate 32 in the second direction Y.

In an exemplary implementation, the second length L2 may be about 0.30*L to 0.33*L. For example, the second length L2 may be about 0.32*L.

In an exemplary implementation, the third pitch K3 between an edge of the initial signal line 31 at a side close to the light emitting control signal line 23 and an edge of the light emitting control signal line 23 at a side close to the initial signal line 31 may be about 0.12*L to 0.16*L. For example, the third pitch K3 may be about 0.14*L.

In an exemplary implementation, for a circuit unit whose unit length L is about 78 μm, the second length L2 may be about 24.6 μm and the third pitch K3 may be about 10.9 μm.

In a display substrate, in order to increase a capacity of a storage capacitor, a second electrode plate 32 with a large area is generally provided. A second length L2 of the second electrode plate 32 is about 0.35*L to 0.38*L, and for a circuit unit whose unit length L is about 78 μm, the second length L2 is about 28 μm. Exemplary embodiments of the present disclosure increase the pitch between the initial signal line 31 and the light emitting control signal line 23 by reducing the lengths of the first electrode plate 24 and the second electrode plate 32 in the second direction Y, and the third pitch K3 may reach 0.12*L to 0.16*L, such that a light transmitting region concentrated and having a large area may be formed between the initial signal line 31 and the light emitting control signal line 23, and the light transmitting region may transmit light so that the display substrate has a certain transmittance.

In an exemplary implementation, the third insulation layer may be about 90 nm to 110 nm in thickness. For example, the third insulation layer may be about 100 nm in thickness. Although the present disclosure reduces the areas of the first electrode plate 24 and the second electrode plate 32, it is possible to ensure that the capacity of the storage capacitor meets the drive requirements by reducing the thickness of the dielectric layer between the first electrode plate 24 and the second electrode plate 32 in the storage capacitor.

Figure 10:
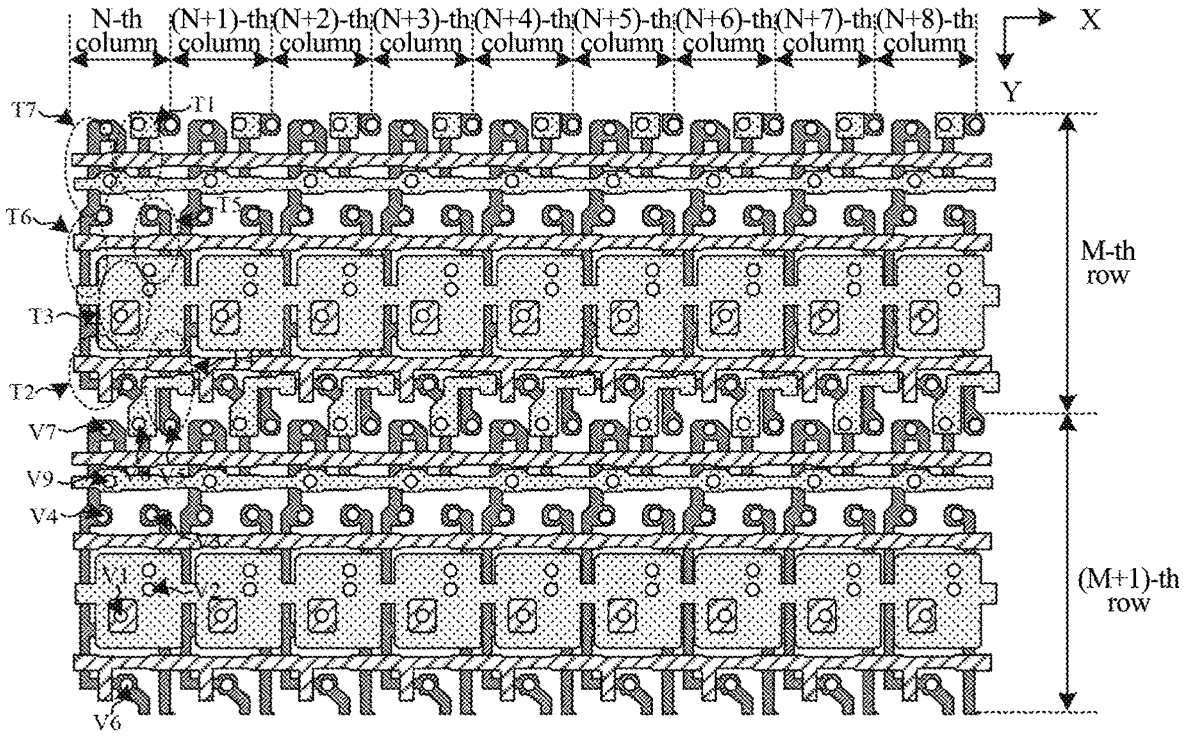
FIG. 10 is a schematic diagram obtained after a pattern of a fourth insulation layer is formed according to an embodiment of the present disclosure.

(4) A pattern of a fourth insulation layer is formed. In an exemplary implementation, forming a pattern of a fourth insulation layer may include: depositing a fourth insulation thin film on the base substrate on which the aforementioned patterns are formed, and patterning the fourth insulation thin film by a patterning process, to form a fourth insulation layer covering the second conductive layer, wherein a plurality of via holes are provided on each of the circuit unit, as shown in FIG. 10.

In an exemplary implementation, the plurality of via holes of each circuit unit may at least include a first via hole V1, a second via hole V2, a third via hole V3, a fourth via hole V4, a fifth via hole V5, a sixth via hole V6, a seventh via hole V7, an eighth via hole V8 and a ninth via hole V9.

In an exemplary implementation, an orthographic projection of the first via hole V1 on the base substrate is located within a range of an orthographic projection of the opening 35 on the second electrode plate 32 on the base substrate, the fourth insulation layer and the third insulation layer within the first via hole V1 are etched away to expose a surface of the first electrode plate 24, and the first via hole V1 is configured such that the first connection electrode subsequently formed is connected with the first electrode plate 24 through the via hole.

In an exemplary implementation, an orthographic projection of the second via hole V2 on the base substrate is within a range of an orthographic projection of the second electrode plate 32 on the base substrate, the fourth insulation layer in the second via hole V2 is etched away to expose a surface of the second electrode plate 32, and the second via hole V2 is configured such that the first power supply line formed subsequently is connected with the second electrode plate 32 through the via hole V2. In an exemplary implementation, the second via hole V2 may be plural, and the plurality of second via holes V2 may be sequentially arranged along the second direction Y, thereby increasing the connection reliability between the first power supply line and the second electrode plate 32.

In an exemplary implementation, an orthographic projection of the third via hole V3 on the base substrate is within a range of an orthographic projection of the first region of the fifth active layer on the base substrate. The fourth insulation layer, the third insulation layer and the second insulation layer in the third via hole V3 are etched away to expose a surface of the first region of the fifth active layer, and the third via hole V3 is configured such that the first power supply line formed subsequently is connected with the first region of the fifth active layer through the via hole V3.

In an exemplary implementation, an orthographic projection of the fourth via hole V4 on the base substrate is within a range of an orthographic projection of the second region (also the second region of the seventh active layer) of the sixth active layer on the base substrate. The fourth insulation layer, the third insulation layer and the second insulation layer in the fourth via hole V4 are etched away to expose a surface of the second region of the sixth active layer, the fourth via hole V4 is configured such that the second electrode (also the second electrode of the seventh transistor T7) of the sixth transistor T6 formed subsequently is connected with the second region of the sixth active layer (also the second region of the seventh active layer) through the via hole V4.

In an exemplary implementation, an orthographic projection of the fifth via hole V5 on the base substrate is within a range of an orthographic projection of the first region of the fourth active layer on the base substrate. The fourth insulation layer, the third insulation layer and the second insulation layer in the fifth via hole V5 are etched away to expose a surface of the first region of the fourth active layer, and the fifth via hole V5 is configured such that the data signal line formed subsequently is connected with the first region of the fourth active layer through the via hole V5.

In an exemplary implementation, an orthographic projection of the sixth via hole V6 on the base substrate is within a range of an orthographic projection of the second region (also the first region of the second active layer) of the first active layer on the base substrate, the fourth insulation layer, the third insulation layer and the second insulation layer within the second via hole V6 are etched away to expose a surface of the second region of the first active layer, and the sixth via hole V6 is configured such that the first connection electrode subsequently formed is connected to the second region (also the first region of the second active layer) of the first active layer through this via hole.

In an exemplary implementation, an orthographic projection of the seventh via hole V7 on the base substrate is within a range of an orthographic projection of the first region (also the first region of the seventh active layer) of the first active layer on the base substrate. The fourth insulation layer, the third insulation layer and the second insulation layer in the seventh via hole V7 are etched away to expose a surface of the first region of the first active layer, the seventh via hole V7 is configured such that the first electrode (also the first electrode of the seventh transistor T7) of the first transistor T1 formed subsequently is connected with the first region (also the first region of the seventh active layer) of the first active layer through the via hole V7.

In an exemplary implementation, the orthographic projection of the eighth via hole V8 on the base substrate is within the range of the orthographic projection of the shielding electrode 34 on the base substrate. The fourth insulation layer in the eighth via hole V8 is etched away, exposing the surface of the shielding electrode 34, and the eighth via hole V8 is configured such that the subsequently formed first power supply line is connected to the shielding electrode 34 through the via hole.

In an exemplary implementation, an orthographic projection of the ninth via hole V9 on the base substrate is within a range of an orthographic projection of the initial signal line 31 on the base substrate, the fourth insulation layer in the ninth via hole V9 is etched away to expose a surface of the initial signal line 31, and the ninth via hole V9 is configured such that the first electrode (also the first electrode of the second transistor T7) of the first transistor T1 formed subsequently is connected with the initial signal line 31 through the via hole V9.

Figure 11A:
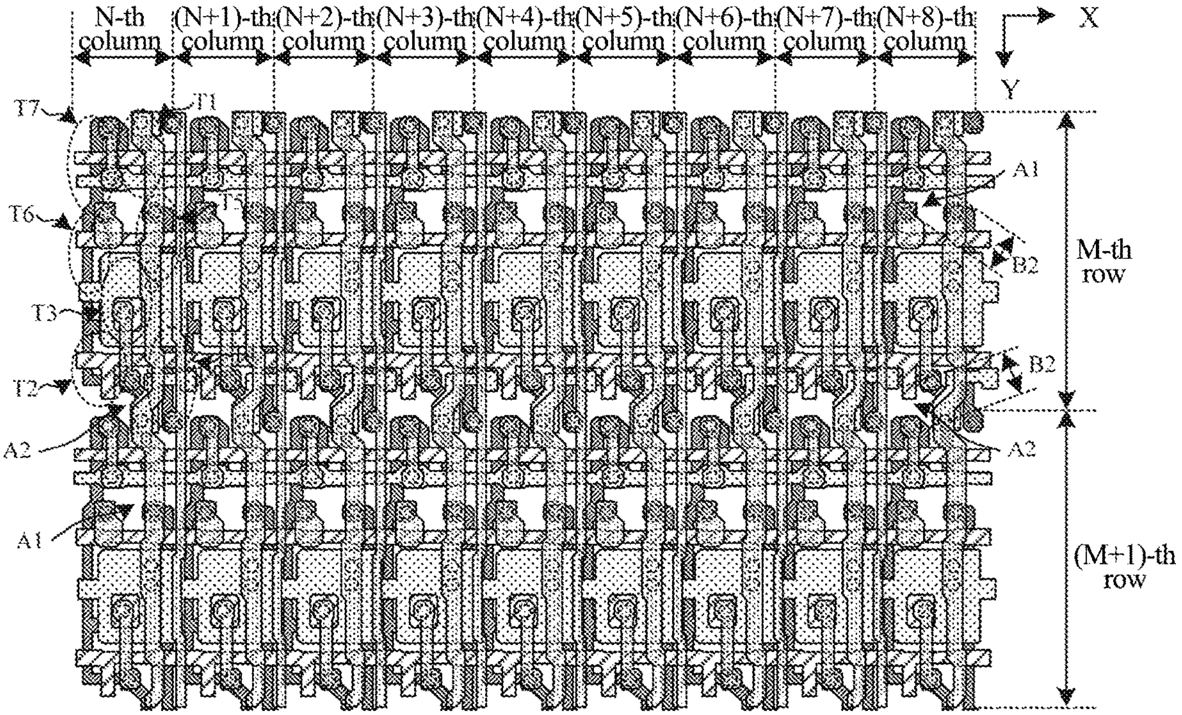
FIG. 11A and FIG. 11B are schematic diagrams obtained after a pattern of a third conductive layer is formed in accordance with an embodiment of the present disclosure.
Figure 11B:
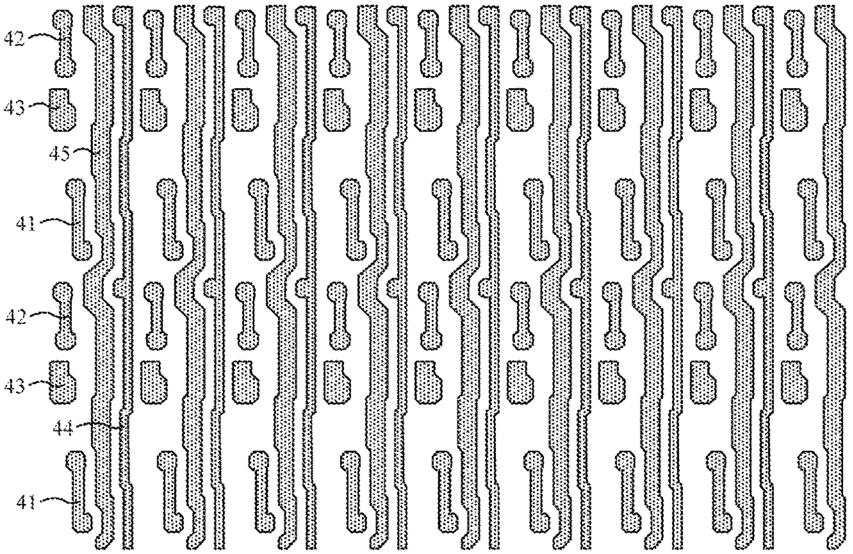

(5) A pattern of a third conductive layer is formed. In an exemplary implementation, forming the third conductive layer may include: depositing a third conductive thin film on the base substrate on which the aforementioned patterns are formed, and patterning the third conductive thin film by a patterning process to form the third conductive layer arranged on the fourth insulation layer, as shown in FIG. 11A and FIG. 11B, FIG. 11B being a planar schematic diagram of the third conductive layer in FIG. 11A. In an exemplary implementation, the third conductive layer may be referred to as a first source-drain metal (SD1) layer.

In an exemplary implementation, the third conductive layer of each circuit unit at least includes a first connection electrode 41, a second connection electrode 42, a third connection electrode 43, a data signal line 44, and a first power supply line 45.

In an exemplary implementation, a shape of the first connection electrode 41 may be a strip shape extending along the second direction Y, a first end of the first connection electrode 41 is connected to the first electrode plate 24 through the first via hole V1, and a second end of the first connection electrode 41 is connected to the second region (also the first region of the second active layer) of the first active layer through the sixth via hole V6, achieving a connection between the first electrode plate 24, and the second electrode of the first transistor and the first electrode of the second transistor T2 which are of an integral structure, which makes the first electrode plate 24, a second electrode of the first transistor T1 and a first electrode of the second transistor T2 have the same potential. In an exemplary implementation, the first connection electrode 41 may serve as the second node N2 in the pixel drive circuit.

In an exemplary implementation, a shape of the second connection electrode 42 may be a strip shape extending along the second direction Y, a first end of the second connection electrode 42 is connected with the first region (also the first region of the seventh active layer) of the first active layer through the seventh via hole V7, and a second end of the second connection electrode 42 is connected with the initial signal line 31 through the ninth via hole V9, which makes the initial signal line 31 write an initial voltage signal into the first transistor T1 and the seventh transistor T7. In an exemplary implementation, the second connection electrode 42 may serve as the first electrode of the first transistor T1 and the first electrode of the seventh transistor T7 simultaneously.

In an exemplary implementation, a shape of the third connection electrode 43 may be a multilateral shape, and the third connection electrode 43 is connected to the second region (also the second region of the seventh active layer) of the sixth active layer through the fourth via hole V4, which makes the second electrode of the sixth transistor T6 and the second electrode of the seventh transistor T7 have a same potential. In an exemplary implementation, the third connection electrode 43 may serve as the second electrode of the sixth transistor T6 and the second electrode of the seventh transistor T7 simultaneously, and the third connection electrode 43 serves as an anode connection electrode and is configured to be connected with an anode formed subsequently.

In an exemplary implementation, a shape of the data signal line 44 may be a line shape in which a main body portion extends along the second direction Y, and the data signal line 44 is connected with a first region of the fourth active layer through the fifth via hole V5, achieving that the data signal line 44 writes a data signal into the fourth transistor T4.

In an exemplary implementation, a shape of the first power supply line 45 may be a bend line shape in which a main body portion extends along the second direction Y. On the one hand, the first power supply line 45 is connected with the second electrode plate 32 through the second via hole V2, on the other hand, the first power supply line 45 is connected with the first region of the fifth active layer through the third via hole V3, and on still another hand, the first power supply line 45 is connected with the shielding electrode 34 through the eighth via hole V8, achieving that the first power supply line 45 writes a first power supply signal into the fifth transistor T5, and the second electrode plate 32 and the shielding electrode 34 have the same potential as the first power supply line 45.

In an exemplary implementation, an orthographic projection of a strip portion of the shielding electrode 34 extending along the first direction X on the base substrate is at least partially overlapped with an orthographic projection of the data signal line 44 on the base substrate. Because the orthographic projection of the strip portion of the shielding electrode 34 on the base substrate is at least partially overlapped with the orthographic projection of the first region of the second active layer on the base substrate, and the shielding electrode 34 is connected to the first power supply line 45, the shielding electrode 34 may effectively shield an influence of the data voltage jump on the second node N2 in the pixel drive circuit, avoid the data voltage jump influencing the potential of the key node of the pixel drive circuit, and improve the display effect.

In the exemplary implementation, the first connection electrode 41 and the data signal line 44 are respectively located on both sides of the first power supply line 45 in the first direction X. Because the first power supply line 45 is a constant voltage signal, the first power supply line 45 may effectively shield an influence of the data voltage jump on the second node N2 in the pixel drive circuit, thus avoiding the data voltage jump affecting the potential of the key node in the pixel drive circuit, and improving the display effect.

In an exemplary implementation, the first power supply line 45 of at least one circuit unit may be in a bend line shape of non-equal width. The first power supply line 45 is set as a bend line, which not only may facilitate a layout of the pixel structures, but also may reduce parasitic capacitance between the first power supply line and the data signal line.

In an exemplary implementation, the circuit unit is formed with at least one light transmitting region, which may at least include a first light transmitting region A1 and a second light transmitting region A2, wherein the first light transmitting region A1 and the second light transmitting region A2 may transmit light such that the display substrate has a certain transmittance.

In an exemplary implementation, orthographic projections of the pattern of the semiconductor layer, the pattern of the first conductive layer, the pattern of the second conductive layer and the pattern of the third conductive layer on the base substrate are not overlapped with an orthographic projection of the first light transmitting region A1 on the base substrate, and the orthographic projections of the pattern of the semiconductor layer, the pattern of the first conductive layer, the pattern of the second conductive layer and the pattern of the third conductive layer on the base substrate are not overlapped with an orthographic projection of the second light transmitting region A2 on the base substrate.

In an exemplary implementation, film layers of the first light transmitting region A1 and the second light transmitting region A2 may at least include a first insulation layer arranged on the base substrate, a second insulation layer arranged on a side of the first insulation layer away from the base substrate, a third insulation layer arranged on a side of the second insulation layer away from the base substrate, a fourth insulation layer arranged on a side of the third insulation layer away from the base substrate, and a planarization layer formed subsequently. Because the base substrate and the above insulation layers are both transparent film layers, the first light transmitting region A1 and the second light transmitting region A2 may transmit light, a transmittance of the first light transmitting region A1 may be greater than or equal to 60%, and a transmittance of the second light transmitting region A2 may be greater than or equal to 60%.

In an exemplary implementation, the first light transmitting region A1 may be located on a side of the storage capacitor in an opposite direction of the second direction Y, and the second light transmitting region A2 may be located on a side of the storage capacitor in the second direction Y.

In an exemplary implementation, an area of an orthographic projection of the first light transmitting region A1 on the plane of the display substrate may be greater than or equal to 0.02*S, an area of an orthographic projection of the second light transmitting region A2 on the plane of the display substrate may be greater than or equal to 0.02*S, and an area of the first light transmitting region A1 may be greater than an area of the second light transmitting region A2, wherein S is a unit area. For example, the area of the orthographic projection of the first light transmitting region A1 on the plane of the display substrate may be about 0.02*S to 0.07*S, and the area of the orthographic projection of the second light transmitting region A2 on the plane of the display substrate may be about 0.02*S to 0.07*S. For another example, the area of the orthographic projection of the first light transmitting region A1 on the plane of the display substrate may be about 0.32*S, and the area of the orthographic projection of the second light transmitting region A2 on the plane of the display substrate may be about 0.30 S.

In an exemplary implementation, the first light transmitting region A1 in the circuit unit may be roughly surrounded by the initial signal line 31, the first power supply line 45, the third connection electrode 43, and the light emitting control signal line 23. In the first direction X (a direction of the unit row), the first light transmission region A1 may be located between the third connection electrode (the second electrode of the sixth transistor T6) 43 and the first power supply line 45, and in the second direction Y (a direction of the unit column), the first light transmission region A1 may be located between the initial signal line 31 and the light emission control signal line 23.

In an exemplary implementation, the second light transmitting region A2 in the circuit unit may be roughly surrounded by the first scan signal line 21, the first power supply line 45, the second scan signal line 22, and the data signal line 44. In the first direction X, the second light transmitting region A2 may be located between the data signal line 44 and the first power supply line 45, and in the second direction Y, the second light transmitting region A2 may be located between the first scan signal line 21 of the circuit unit in the M-th circuit row and the second scan signal line 22 of the circuit unit in the (M+1)-th circuit row.

In an exemplary implementation, the first light transmitting region A1 may have a second dimension B2, or the second light transmitting region A2 may have a second dimension B2, which may be a maximum distance between two edges in the first light transmitting region A1 or between two edges in the second light transmitting region A2.

Figure 12:
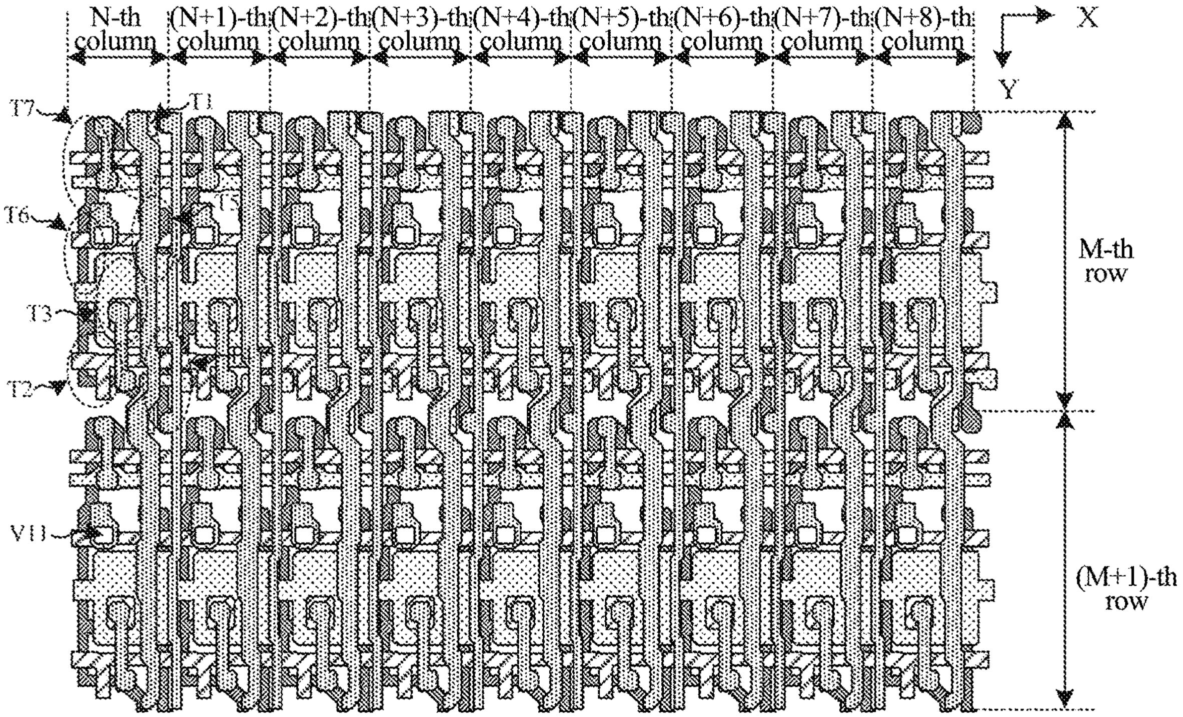
FIG. 12 is a schematic diagram obtained after a pattern of a planarization layer is formed according to an embodiment of the present disclosure.

(6) A pattern of a planarization layer is formed. In an exemplary implementation, forming a pattern of a planarization layer may include coating a planarization thin film on the base substrate on which the above patterns are formed, patterning the planarization thin film through a patterning process, forming a planarization layer covering the third conductive layer, wherein the planarization layer is provided with a plurality of via holes, as shown in FIG. 12.

In an exemplary implementation, via holes in each circuit unit at least includes an eleventh via hole V11. An orthographic projection of the eleventh via hole V11 on the base substrate is located within a range of an orthographic projection of the third connection electrode 43 on the base substrate, a first planarization layer in the eleventh via hole V11 is removed to expose a surface of the third connection electrode 43, and the eleventh via hole V11 is configured such that the anode formed subsequently is connected with the third connection electrode 43 through this via hole.

So far, the drive circuit layer has been prepared on the base substrate. On a plane parallel to the display substrate, the drive circuit layer may include a plurality of circuit units, each of the circuit units may include a pixel drive circuit, and a first scan signal line, a second scan signal line, a light emitting control signal line, an initial signal line, a data signal line, and a first power supply line connected to the pixel drive circuit. On a plane perpendicular to the display substrate, the drive circuit layer may include a first insulation layer, a semiconductor layer, a second insulation layer, a first conductive layer, a third insulation layer, a second conductive layer, a fourth insulation layer, a third conductive layer, a planarization layer which are stacked sequentially on the base substrate.

In an exemplary implementation, the base substrate may be a flexible base substrate, or a rigid base substrate. The rigid base substrate may be made of, but is not limited to, one or more of glass and quartz. The flexible base substrate may be made of, but is not limited to, one or more of polyethylene terephthalate, ethylene terephthalate, polyether ether ketone, polystyrene, polycarbonate, polyarylate, polyarylester, polyimide, polyvinyl chloride, polyethylene, and textile fibers. In an exemplary implementation, the flexible base substrate may include a first flexible material layer, a first inorganic material layer, a semiconductor layer, a second flexible material layer, and a second inorganic material layer which are stacked, wherein materials of the first flexible material layer and the second flexible material layer may be Polyimide (PI), Polyethylene Terephthalate (PET), or a surface-treated polymer soft film, or the like, materials of the first inorganic material layer and the second inorganic material layer may be Silicon Nitride (SiNx) or Silicon Oxide (SiOx), or the like, for improving a water and oxygen resistance capability of the base substrate, and a material of the semiconductor layer may be amorphous silicon (a-si).

In an exemplary implementation, the first conductive layer, the second conductive layer, and the third conductive layer may be made of a metal material, for example, any one or more of Argentum (Ag), Copper (Cu), Aluminum (Al), and Molybdenum (Mo), or an alloy material of the above-mentioned metals, for example, an Aluminum-Neodymium alloy (AlNd) or a Molybdenum-Niobium alloy (MoNb), and may be in a single-layer structure, or in a multilayer composite structure such as Mo/Cu/Mo, etc. The first insulation layer, the second insulation layer, the third insulation layer, and the fourth insulation layer may be made of any one or more of Silicon Oxide (SiOx), Silicon Nitride (SiNx), and Silicon Oxynitride (SiON), and may be a single layer, a multi-layer, or a composite layer. The first insulation layer may be referred to as a buffer layer, the second insulation layer and the third insulation layer may be referred to as Gate Insulator (GI) layers, and the fourth insulation layer may be referred to as an Interlayer Dielectric (ILD) layer. The planarization layer may be made of an organic material such as resin. An active layer may be made of a material such as amorphous Indium Gallium Zinc Oxide (a-IGZO), Zinc Oxynitride (ZnON), Indium Zinc Tin Oxide (IZTO), amorphous Silicon (a-Si), poly Silicon (p-Si), hexathiophene, or polythiophene. That is, the present disclosure is applicable to a transistor that is manufactured based on an oxide technology, a silicon technology, or an organic matter technology.

In an exemplary implementation, after preparation of the drive circuit layer is completed, a light emitting structure layer is prepared on the drive circuit layer, and a preparation process of the light emitting structure layer may include following operations.

Figure 13A:
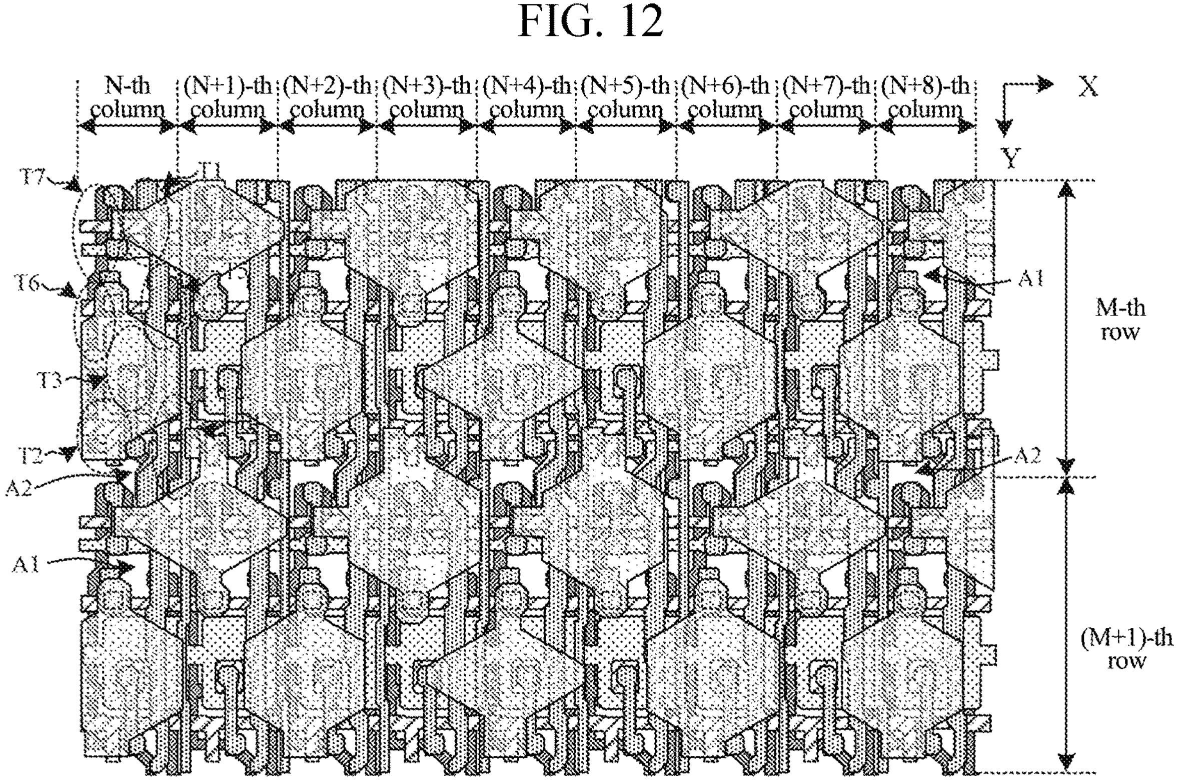
FIG. 13A and FIG. 13B are schematic diagrams obtained after a pattern of an anode conductive layer is formed according to an embodiment of the present disclosure.
Figure 13B:
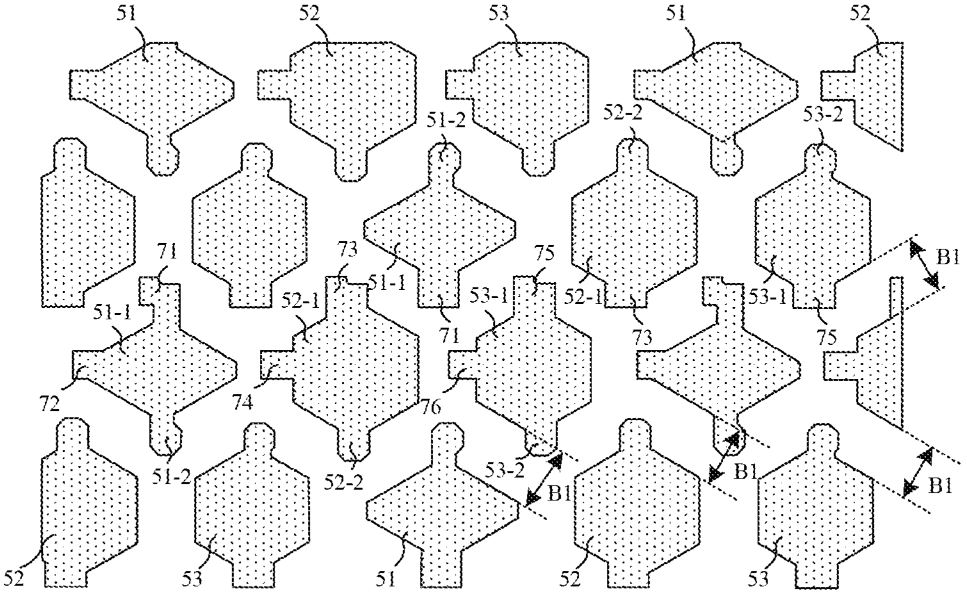

(9) A pattern of an anode conductive layer is formed. In an exemplary implementation, forming a pattern of an anode conductive layer may include: depositing an anode conductive thin film on the base substrate on which the aforementioned patterns are formed, and patterning the anode conductive thin film through a patterning process to form the pattern of the anode conductive layer arranged on the planarization layer, as shown in FIG. 13A and FIG. 13B, and FIG. 13B is a planar schematic diagram of the anode conductive layer in FIG. 13A.

In an exemplary implementation, the pattern of the anode conductive layer may at least include a plurality of anodes, which may include a first anode 51 of a red light emitting unit (the first light emitting unit), a second anode 52 of a blue light emitting unit (the second light emitting unit), and a third anode 53 of a green light emitting unit (the third light emitting unit), wherein red light may be emitted in a region in which the first anode 51 is located, blue light may be emitted in a region in which the second anode 52 is located, and green light may be emitted in which the third anode 53 is located.

In an exemplary implementation, the first anode 51, the second anode 52 and the third anode 53 may be respectively connected to the third connection electrode 43 in the circuit unit through the eleventh via hole V11. Because the third connection electrode 43 in the circuit unit is connected to the second region (also the second region of the seventh active layer) of the sixth active layer through a via hole, the first anode 51, the second anode 52 and the third anode 53 may be respectively connected to the second electrode of the sixth transistor T6 and the second electrode of the seventh transistor T7 through the third connection electrode 43, thereby achieving that the pixel drive circuit drives the light emitting device to emit light.

In an exemplary implementation, a plurality of light emitting units formed by a plurality of anodes may form a plurality of pixel rows and a plurality of pixel columns, wherein the pixel rows may include a plurality of light emitting units sequentially arranged along the first direction X, and the pixel columns may include a plurality of light emitting units sequentially arranged along the second direction Y.

In an exemplary implementation, positions of a plurality of light emitting units of two pixel rows (an odd-numbered pixel row and an adjacent even-numbered pixel row) correspond to positions of a plurality of pixel drive circuits of one unit row. Orthographic projections of anodes of the two pixel rows on the base substrate are at least partially overlapped with orthographic projections of the pixel drive circuits of the one unit row on the base substrate, that is, a region of one unit row corresponds to regions of the two pixel rows, the first anode 51, the second anode 52 and the third anode 53 in each pixel row may be arranged periodically in the first direction X and the first anode 51, the second anode 52 and the third anode 53 of the adjacent pixel row are dislocated, and a plurality of first anodes 51, a plurality of second anodes 52 and a plurality of third anodes 53 in odd-numbered pixel rows and adjacent even-numbered pixel rows may be correspondingly connected to pixel drive circuits of a plurality of circuit units of the same unit row. For example, in FIG. 13A, a plurality of anodes of the first anode row (an odd-numbered pixel row) and a plurality of anodes of the second anode row (an even-numbered pixel row) are all correspondingly connected to pixel drive circuits in circuit units of an M-th row. For another example, in FIG. 13A, a plurality of anodes of the third anode row (an odd-numbered pixel row) and a plurality of anodes of the fourth anode row (an even-numbered pixel row) are all correspondingly connected to pixel drive circuits in circuit units of an (M+1)-th row.

In an exemplary implementation, positions of a plurality of light emitting units of one pixel column correspond to positions of a plurality of pixel drive circuits of one unit column. An orthographic projection of an anode in one pixel column on the base substrate is at least partially overlapped with orthographic projections of pixel drive circuits in one unit column on the base substrate, that is, a region of one unit column corresponds to a region of one pixel column, each pixel column includes a plurality of anodes sequentially arranged in the second direction Y, and a plurality of anodes of adjacent pixel columns are dislocated. The plurality of anodes of the pixel column may be a plurality of first anodes 51, or the plurality of anodes of the pixel column may be a plurality of second anodes 52, or the plurality of anodes of the pixel column may be a plurality of third anodes 53.

In an exemplary implementation, in the first direction X, a first anode 51 of one pixel row may be located between a second anode 52 and a third anode 53 of an adjacent pixel row, and the three anodes form a triangular arrangement. In the first direction X, a second anode 52 of one pixel row may be located between a third anode 53 and a first anode 51 of an adjacent pixel row, and the three anodes form a triangular arrangement. In the first direction X, a third anode 53 of one pixel row may be located between a first anode 51 and a second anode 52 of an adjacent pixel row, and the three anodes form a triangular arrangement. Thus, the plurality of first anodes 51, the plurality of second anodes 52 and the plurality of third anodes 53 form a Delta arrangement.

In an exemplary implementation, in the second direction Y, a first anode 51 of one pixel column may be located between two second anodes 52 of an adjacent pixel column, a first anode 51 of one pixel column may be located between two third anodes 53 of another adjacent pixel column, and the one first anode 51, the two second anodes 52, and the two third anodes 53 may form four triangular arrangements. In the second direction Y, the second anode 52 of one pixel column may be located between two first anodes 51 of an adjacent pixel column, the second anode 52 of one pixel column may be located between two third anodes 53 of another adjacent pixel column, and the two first anodes 51, the one second anode 52, and the two third anodes 53 may form four triangular arrangements. In the second direction Y, a third anode 53 of one pixel column may be located between two second anodes 52 of an adjacent pixel column, a third anode 53 of one pixel column may be located between two first anodes 51 of another adjacent pixel column, and the two first anodes 51, the two second anodes 52 and the one third anode 53 may form four triangles.

In an exemplary implementation, shapes and areas of the first anode 51, the second anode 52 and the third anode 53 may be different.

In an exemplary implementation, the plurality of pixel rows may include odd-numbered pixel rows and even-numbered pixel rows. A shape and an area of the first anode 51 of an odd-numbered pixel row may be different from a shape and an area of the first anode 51 of an even-numbered pixel row, a shape and an area of the second anode 52 of an odd-numbered pixel row may be different from a shape and an area of the second anode 52 of an even-numbered pixel row, and a shape and an area of the third anode 53 of an odd-numbered pixel row may be different from a shape and an area of the third anode 53 of an even-numbered pixel row.

In an exemplary implementation, the plurality of pixel columns may include odd-numbered pixel columns and even-numbered pixel columns. A shape and an area of the first anode 51 of an odd-numbered pixel column may be different from a shape and an area of the first anode 51 of an even-numbered pixel column, a shape and an area of the second anode 52 of an odd-numbered pixel column may be different from a shape and an area of the second anode 52 of an even-numbered pixel column, and a shape and an area of the third anode 53 of an odd-numbered pixel column may be different from a shape and an area of the third anode 53 of an even-numbered pixel column.

In an exemplary implementation, the first anode 51 may include a first anode main body portion 51-1 and a first anode connection portion 51-2, wherein a shape of the first anode main body portion 51-1 may be a rhombus-like shape, a shape of the first anode connection portion 51-2 may be a strip shape extending along the second direction Y and is connected to the first anode main body portion 51-1, and the first anode connection portion 51-2 is configured to be connected to a corresponding third connection electrode 43 through the eleventh via hole V11.

In an exemplary implementation, the first anode connection portion 51-2 of an odd-numbered pixel column may be arranged on a side of the first anode main body portion 51-1 in an opposite direction of the second direction Y, and the first anode connection portion 51-2 of an even-numbered pixel column may be arranged on a side of the first anode main body portion 51-1 in the second direction Y.

In an exemplary implementation, the first anode 51 may further include a first protrusion portion 71, wherein a shape of the first protrusion portion 71 may be a strip shape extending along the second direction Y, a first end of the first protrusion portion 71 is connected to the first anode main body portion 51-1, and a second end of the first protrusion portion 71 extends towards a direction away from the first anode main body portion 51-1.

In an exemplary implementation, the first protrusion portion 71 may be arranged on a side of the first anode main body portion 51-1 away from the first anode connection portion 51-2. For example, the first protrusion portion 71 of an odd-numbered pixel column may be arranged on a side of the first anode main body portion 51-1 in the second direction Y, and the first protrusion portion 71 of an even-numbered pixel column may be arranged on a side of the first anode main body portion 51-1 in an opposite of the second direction Y.

In an exemplary implementation, an orthographic projection of the first protrusion portion 71 on the base substrate is at least partially overlapped with orthographic projections of the first scan signal line 21 and the gate block 21-1 on the base substrate, and the first protrusion portion 71 is configured to shield a second transistor T2 of a corresponding circuit unit, thereby improving the electrical performance of the second transistor T2 and improving the display quality and display effect.

In an exemplary implementation, the first anode 51 of an even-numbered pixel column may include a second protrusion portion 72. A shape of the second protrusion portion 72 may be s strip shape extending along the first direction X, a first end of the second protrusion portion 72 is connected to a first anode main body portion 51-1, and a second end of the second protrusion 72 extends along a direction away from the first anode main body portion 51-1. In an exemplary implementation, the first anode 51 of an odd-numbered pixel column may not be provided with the second protrusion portion 72.

In an exemplary implementation, the second protrusion portion 72 of an even-numbered pixel column may be arranged on a side of the first anode main body portion 51-1 in an opposite of the first direction X, an orthographic projection of the second protrusion portion 72 on the base substrate is at least partially overlapped with orthographic projections of the second connection electrode 42 and the first power supply line 45 in the previous column of the circuit unit on the base substrate, and the second protrusion portion 72 is configured to adjust a flatness of the first anode 51 of an even-numbered pixel column so that wires of a third conductive layer on both sides of the first anode 51 in the first direction X are as symmetrical as possible, which reduces brightness differences, and improve the display quality and the display effect.

In an exemplary implementation, the first anode main body portion 51-1, the first anode connection portion 51-2, and the first protrusion portion 71 of an odd-numbered pixel column may be of an integral structure connected to each other, and the first anode main body portion 51-1, the first anode connection portion 51-2, the first protrusion portion 71, and the second protrusion portion 72 of an even-numbered pixel column may be of an integral structure connected to each other.

In an exemplary implementation, the second anode 52 may include a second anode main body portion 52-1 and a second anode connection portion 52-2, wherein a shape of the second anode main body portion 52-1 may be a hexagon-like shape, a shape of the second anode connection portion 52-2 may be a strip shape extending along the second direction Y and is connected to the second anode main body portion 52-1, and the second anode connection portion 52-2 is configured to be connected to a corresponding third connection electrode 43 through the eleventh via hole V11.

In an exemplary implementation, the second anode connection portion 52-2 of an odd-numbered pixel column may be arranged on a side of the second anode main body portion 52-1 in an opposite of the second direction Y, and the second anode connection portion 52-2 of an even-numbered pixel column may be arranged on a side of the second anode main body portion 52-1 in the second direction Y.

In an exemplary implementation, the second anode 52 may further include a third protrusion portion 73, wherein a shape of the third protrusion portion may be a strip shape extending along the second direction Y, a first end of the third protrusion portion is connected to the second anode main body portion 52-1, and a second end of the third protrusion portion 73 extends along a direction away from the second anode main body portion 52-1.

In an exemplary implementation, the third protrusion portion 73 may be arranged on a side of the second anode main body portion 52-1 away from the second anode connection portion 52-2. For example, the third protrusion portion 73 of an odd-numbered pixel column may be arranged on a side of the second anode main body portion 52-1 in the second direction Y, and the third protrusion portion 73 of an even-numbered pixel column may be arranged on a side of the second anode main body portion 52-1 in an opposite direction of the second direction Y.

In an exemplary implementation, an orthographic projection of the third protrusion portion 73 on the base substrate is at least partially overlapped with orthographic projections of the first scan signal line 21 and the gate block 21-1 on the base substrate, and the third protrusion portion 73 is configured to shield a second transistor T2 of a corresponding circuit unit, thereby improving the electrical performance of the second transistor T2 and improving the display quality and display effect.

In an exemplary implementation, the second anode 52 of an even-numbered pixel column may include a fourth protrusion portion 74. A shape of the fourth protrusion portion 74 may be a strip shape extending along the first direction X, a first end of the fourth protrusion portion 74 is connected to the second anode main body portion 52-1, and a second end of the fourth protrusion portion 74 extends along a direction away from the second anode main body portion 52-1. In an exemplary implementation, the second anode 52 of an odd-numbered pixel column may not be provided with the fourth protrusion portion 74.

In an exemplary implementation, the fourth protrusion portion 74 of an even-numbered pixel column may be arranged on a side of the second anode main body portion 52-1 in an opposite of the first direction X, an orthographic projection of the fourth protrusion portion 74 on the base substrate is at least partially overlapped with orthographic projections of the second connection electrode 42 and the first power supply line 45 in the previous column of the circuit unit on the base substrate, and the fourth protrusion portion 74 is configured to adjust a flatness of the second anode 52 of an even-numbered pixel column so that wires of a third conductive layer on both sides of the second anode 52 in the first direction X are as symmetrical as possible, which reduces brightness differences, and improve the display quality and the display effect.

In an exemplary implementation, the second anode main body portion 52-1, the second anode connection portion 52-2, and the third protrusion portion 73 of an odd-numbered pixel column may be of an integral structure connected to each other, and the first anode body portion 51-1, the first anode connection portion 51-2, the third protrusion portion 73, and the fourth protrusion portion 74 of an even-numbered pixel column may be of an integral structure connected to each other.

In an exemplary implementation, the third anode 53 may include a third anode main body portion 53-1 and a third anode connection portion 53-2, wherein a shape of the third anode main body portion 53-1 may be a hexagon-like shape, a shape of the third anode connection portion 53-2 may be a strip shape extending along the second direction Y and is connected to the third anode main body portion 53-1, and the third anode connection portion 53-2 is configured to be connected to a corresponding third connection electrode 43 through the eleventh via hole V11.

In an exemplary implementation, the third anode connection portion 53-2 of an odd-numbered pixel column may be arranged on a side of the third anode main body portion 53-1 in an opposite of the second direction Y, and the third anode connection portion 53-2 of an even-numbered pixel column may be arranged on a side of the third anode main body portion 53-1 in the second direction Y.

In an exemplary implementation, the third anode 53 may further include a fifth protrusion portion 75, wherein a shape of the fifth protrusion portion may be a strip shape extending along the second direction Y, a first end of the fifth protrusion portion is connected to the third anode main body portion 53-1, and a second end of the fifth protrusion portion extends along a direction away from the third anode main body portion 53-1.

In an exemplary implementation, the fifth protrusion portion 75 may be arranged on a side of the third anode main body portion 53-1 away from the third anode connection portion 53-2. For example, the fifth protrusion portion 75 of an odd-numbered pixel column may be arranged on a side of the third anode main body portion 53-1 in the second direction Y, and the fifth protrusion portion 75 of an even-numbered pixel column may be arranged on a side of the third anode main body portion 53-1 in an opposite direction of the second direction Y.

In an exemplary implementation, an orthographic projection of the fifth protrusion portion 75 on the base substrate is at least partially overlapped with orthographic projections of the first scan signal line 21 and the gate block 21-1 on the base substrate, and the fifth protrusion portion 75 is configured to shield a second transistor T2 of a corresponding circuit unit, thereby improving the electrical performance of the second transistor T2 and improving the display quality and display effect.

In an exemplary implementation, the third anode 53 of an even-numbered pixel column may further include a sixth protrusion portion 76. A shape of the sixth protrusion portion 76 may be a strip shape extending along the first direction X, a first end of the sixth protrusion portion 76 is connected to the third anode main body portion 53-1, and a second end of the sixth protrusion portion 76 extends along a direction away from the third anode main body portion 53-1. In an exemplary implementation, the third anode 53 of an odd-numbered pixel column may not be provided with the sixth protrusion portion 76.

In an exemplary implementation, the sixth protrusion portion 76 of an even-numbered pixel column may be arranged on a side of the third anode main body portion 53-1 in an opposite of the first direction X, an orthographic projection of the sixth protrusion portion 76 on the base substrate is at least partially overlapped with orthographic projections of the second connection electrode 42 and the first power supply line 45 in the previous column of the circuit unit on the base substrate, and the sixth protrusion portion 76 is configured to adjust a flatness of the third anode 53 of an even-numbered pixel column so that wires of a third conductive layer on both sides of the third anode 53 in the first direction X are as symmetrical as possible, which reduces brightness differences, and improve the display quality and the display effect.

In an exemplary implementation, the third anode main body portion 53-1, the third anode connection portion 53-2, and the fifth protrusion portion 75 of an odd-numbered pixel column may be of an integral structure connected to each other, and the third anode body portion 53-1, the third anode connection portion 53-2, the fifth protrusion portion 75, and the sixth protrusion portion 76 of an even-numbered pixel column may be of an integral structure connected to each other.

In an exemplary implementation, an orthographic projection of an anode of an odd-numbered pixel row on the base substrate is at least partially overlapped with orthographic projections of a first transistor T1 and a seventh transistor T7 of a pixel drive circuit in a unit row in which the anode is located on the base substrate, and an orthographic projection of an anode of an even-numbered pixel row on the base substrate is at least partially overlapped with orthographic projections of a second transistor T2, a third transistor T3, a fourth transistor T4, a fifth transistor T5 and a sixth transistor T6 of a pixel drive circuit in a unit row in which the anode is located on the base substrate.

In an exemplary implementation, due to arrangement characteristics of a plurality of anodes, orthographic projections of a portion of the first light transmitting region A1 and the second light transmitting region A2 on the base substrate are not overlapped with an orthographic projection of an anode on the base substrate, while orthographic projections of the other portion of the first light transmitting region A1 and the second light transmitting region A2 on the base substrate are overlapped with the orthographic projection of the anode on the base substrate. For example, in the first light transmitting regions A1 of two adjacent circuit units in the first direction X, one first light transmitting region A1 is not shielded by the anode, and the other first light transmitting region A1 is partially shielded by the anode. Both the first light transmitting region A1 and the second light transmitting region A2 described later refer to the first light transmitting region A1 and the second light transmitting region A2 which are not shielded by the anode, and the orthographic projections of the first light transmitting region A1 and the second light transmitting region A2 described later on the base substrate are not overlapped with an orthographic projection of the anode conductive layer on the base substrate.

In an exemplary implementation, the first light transmitting region A1 may be located between a first anode 51 of a first light emitting unit in an odd-numbered pixel row and a second anode 52 of a second light emitting unit in an adjacent next even-numbered pixel row, and the second light transmitting region A2 may be located on a side of the second anode 52 of the second light emitting unit away from the first light transmitting region A1.

In an exemplary implementation, the first light transmitting region A1 may be located between a second anode 52 of a second light emitting unit in an odd-numbered pixel row and a third anode 53 of a third light emitting unit in an adjacent next even-numbered pixel row, and the second light transmitting region A2 may be located on a side of the third anode 53 away from the first light transmitting region A1.

In an exemplary implementation, the first light transmitting region A1 may be located between a third anode 53 of a third light emitting unit in an odd-numbered pixel row and a first anode 51 of a first light emitting unit in an adjacent next even-numbered pixel row, and the second light transmitting region A2 may be located on a side of the first anode 51 away from the first light transmitting region A1.

In an exemplary implementation, there may be a first dimension B1 between one anode in an odd-numbered pixel row and another anode in an adjacent next even-numbered pixel row, or there may be a first dimension B1 between one anode in an even-numbered pixel row and another anode in an adjacent next odd-numbered pixel row, wherein the first dimension B1 may be a minimum distance between edges of two adjacent anode main body portions. For example, a minimum distance between an edge of a first anode main body portion 51-1 of the first anode 51 in an odd-numbered pixel row and an edge of a second anode main body portion 52-1 of the second anode 52 in an adjacent even-numbered pixel row is the first dimension B1. For another example, a minimum distance between an edge of a second anode main body portion 52-1 of the second anode 52 in an odd-numbered pixel row and an edge of a third anode main body portion 53-1 of the third anode 53 in an adjacent even-numbered pixel row is the first dimension B1. For yet another example, a minimum distance between an edge of a third anode main body portion 53-1 of the third anode 53 in an odd-numbered pixel row and an edge of a first anode main body portion 51-1 of the first anode 51 in an adjacent even-numbered pixel row is the first dimension B1.

In an exemplary implementation, a ratio of the second dimension B2 to the first dimension B1 may be greater than or equal to 0.5. For example, the ratio of the second dimension B2 to the first dimension B1 may be about 0.7. For another example, the ratio of the second dimension B2 to the first dimension B1 may be about 1.0. For yet another example, the ratio of the second dimension B2 to the first dimension B1 may be about 1.2.

In an exemplary implementation, the anode conductive layer may be of a single-layer structure, such as Indium Tin Oxide (ITO) or Indium Zinc Oxide (IZO), or may be of a multi-layer composite structure, such as ITO/Ag/ITO.

Figure 14:
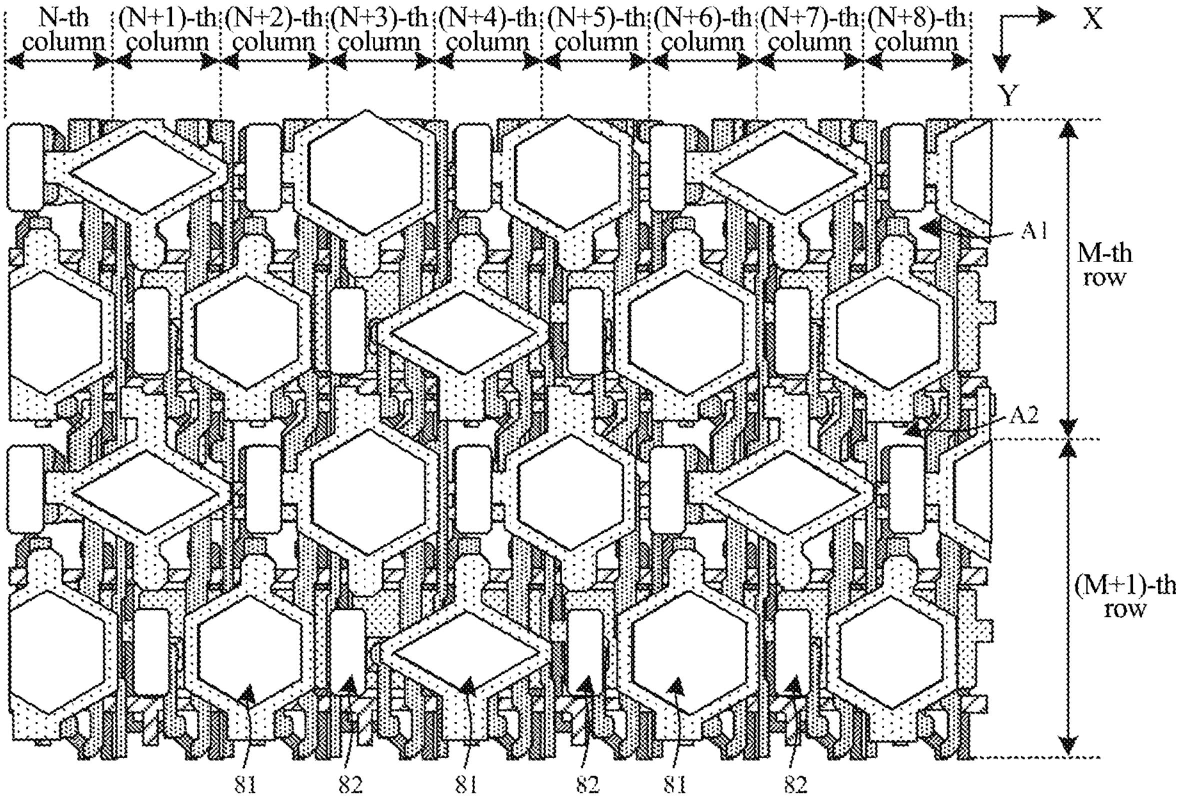
FIG. 14 is a schematic diagram obtained after a pattern of a pixel definition layer is formed according to an embodiment of the present disclosure.

(10) A pattern of a pixel definition layer is formed. In an exemplary implementation, forming the pattern of the pixel definition layer may include: a pixel definition thin film is coated on the base substrate on which the aforementioned patterns are formed; the pixel definition thin film is patterned through a patterning process, so as to form a pattern of a pixel definition layer, as shown in FIG. 14.

In an exemplary implementation, the pattern of the pixel definition layer may include a plurality of pixel openings 81 and a plurality of post spacers 82.

In an exemplary implementation, positions and shapes of the plurality of pixel openings 81 correspond to positions and shapes of the plurality of anodes, and the plurality of pixel openings 81 expose surfaces of the first anode 51, the second anode 52 and the third anode 53, respectively.

In an exemplary implementation, a shape of the post spacer 82 may be a strip shape extending along the second direction Y, the post spacer 82 may be arranged between adjacent pixel openings 81 in the first direction X to avoid the first light transmission region A1 and the second light transmission region A2, an orthographic projection of the post spacer 82 on the base substrate is not overlapped with an orthographic projection of the first light transmission region A1 on the base substrate, and the orthographic projection of the post spacer 82 on the base substrate is not overlapped with an orthographic projection of the second light transmission region A2 on the base substrate, thereby preventing from the light transmission effect being reduced because of an additional organic layer.

In an exemplary implementation, in two adjacent unit rows, an orthographic projection of the post spacer 82 in one unit row on the base substrate is at least partially overlapped with an orthographic projection of the first transistor T1 on the base substrate, and an orthographic projection of the post spacer 82 in another unit row on the base substrate is at least partially overlapped with an orthographic projection of the storage capacitor on the base substrate.

Figure 15:
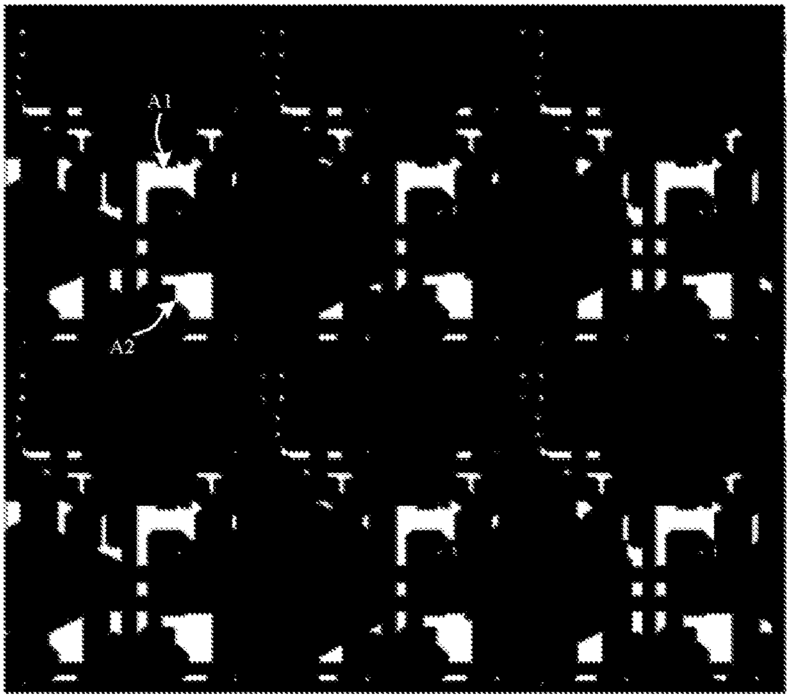
FIG. 15 is a schematic diagram of a light transmitting region of a display substrate according to an exemplary embodiment of the present disclosure.

FIG. 15 is a schematic diagram of a light transmitting region of a display substrate according to an exemplary embodiment of the present disclosure. As shown in FIG. 15, in at least one circuit unit of at least one circuit row, a first light transmitting region A1 distributed concentratedly and having a large area is formed close to the sixth transistor T6, and a second light transmitting region A2 distributed concentratedly and having a large area is formed close to the second transistor T2, so that the display substrate has a certain transmittance.

Figure 16:
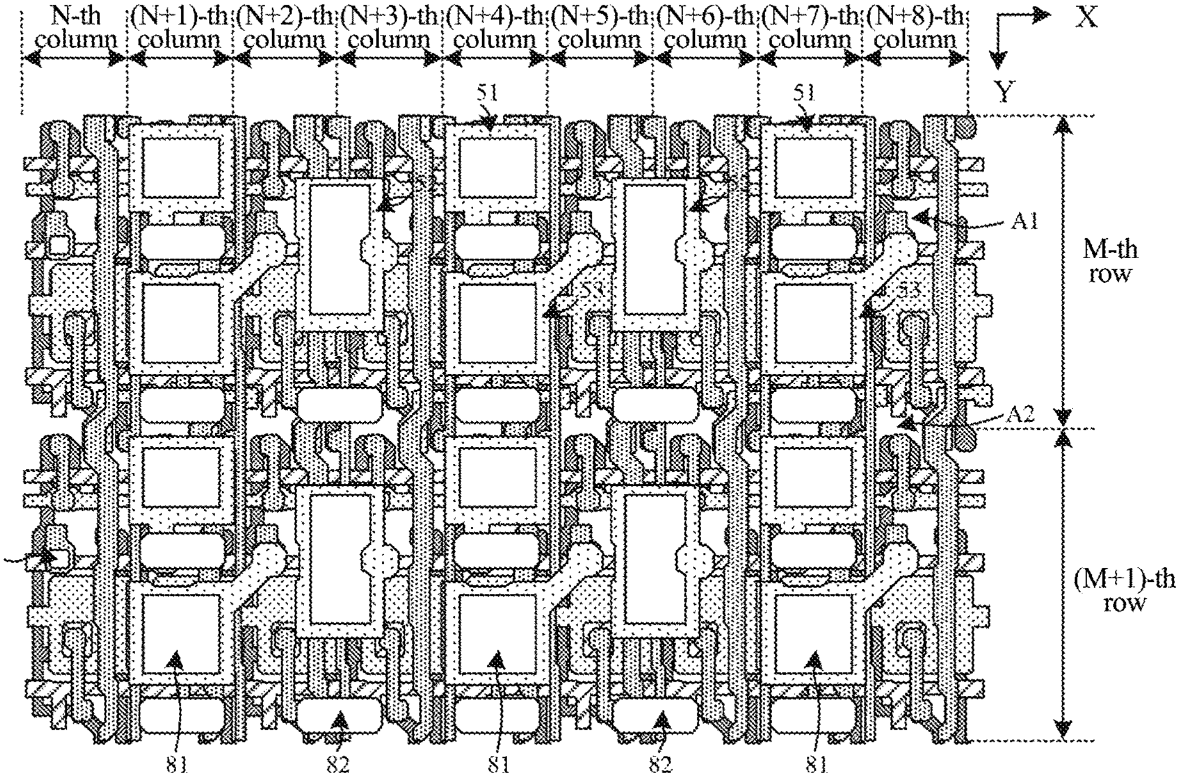
FIG. 16 is another schematic diagram obtained after patterns of an anode and a pixel definition layer are formed according to an embodiment of the present disclosure.

FIG. 16 is another schematic diagram after patterns of an anode and a pixel definition layer are formed according to an exemplary embodiment of the present disclosure. A preparation process for forming the patterns of the anode and the pixel definition layer according to the present embodiment is basically the same as the preparation process described above, except that layouts of the anode and the post spacer are different.

As shown in 16, the pattern of the anode conductive layer may at least include a first anode 51 of a red light emitting unit, a second anode 52 of a blue light emitting unit, and a third anode 53 of a green light emitting unit, wherein a red light emitting unit which emits red light may be formed in a region in which the first anode 51 is located, a blue light emitting unit which emits blue light may be formed in a region in which the second anode 52 is located, and a green light emitting unit which emits green light may be formed in a region in which the third anode 53 is located.

In an exemplary implementation, the first anode 51, the second anode 52 and the third anode 53 may be respectively connected to the third connection electrode 43 in the circuit unit through the eleventh via hole V11.

In an exemplary implementation, a first anode 51, a second anode 52, and a third anode 53 of one pixel unit may be arranged in a triangular arrangement, the first anode 51 and the third anode 53 may be arranged sequentially along the second direction Y, the second anode 52 may be arranged on a side of the first anode 51 and the third anode 53 in the first direction X, and a plurality of first anodes 51, a plurality of second anodes 52, and a plurality of third anodes 53 form an S-strip pixel arrangement.

In an exemplary implementation, shapes and areas of the first anode 51, the second anode 52 and the third anode 53 may be different.

In an exemplary implementation, the first anode 51 may include a first anode main body portion and a first anode connection portion, wherein a shape of the first anode main body portion may be a rectangular shape, a shape of the first anode connection portion may be a strip shape extending along the second direction Y, the first anode connection portion is connected to the first anode main body portion, and the first anode connection portion is configured to be connected with a corresponding third connection electrode through the eleventh via hole.

In an exemplary implementation, the second anode 52 may include a second anode main body portion and a second anode connection portion, wherein a shape of the second anode main body portion may be a rectangular shape, a shape of the second anode connection portion may be a block shape protruding towards the second direction Y and is connected to the second anode main body portion, and the second anode connection portion is configured to be connected to a corresponding third connection electrode through the eleventh via hole.

In an exemplary implementation, the third anode 53 may include a third anode main body portion and a third anode connection portion, wherein a shape of the third anode main body portion may be a rectangular shape, a shape of the third anode connection portion may be a strip shape extending towards the second anode 52 and is connected to the third anode main body portion, and the third anode connection portion is configured to be connected to a corresponding third connection electrode through the eleventh via hole.

In an exemplary implementation, in at least one circuit unit, an initial signal line, a first power supply line, a light emitting control signal line, a third connection electrode, and the like may form a first light transmitting region A1, and the light transmission region may transmit light such that the display substrate has a certain transmittance.

In an exemplary implementation, in at least one circuit unit of at least one circuit row, a first scan signal line, a first power supply line, a second scan signal line, a data signal line, and the like of a circuit unit in an M-th circuit row may form a second light transmission region A2, and the light transmission region may transmit light so that the display substrate has a certain transmittance.

In an exemplary implementation, the pattern of the pixel definition layer may include a plurality of pixel openings 81 and a plurality of post spacers 82.

In an exemplary implementation, positions and shapes of the plurality of pixel openings 81 correspond to positions and shapes of the plurality of anodes, and the plurality of pixel openings 81 expose surfaces of the first anode 51, the second anode 52 and the third anode 53, respectively.

In an exemplary implementation, a shape of the post spacer 82 may be a strip shape extending along the first direction X, the post spacer 82 may be arranged between adjacent pixel openings 81 in the second direction Y to avoid the first light transmission region A1 and the second light transmission region A2, an orthographic projection of the post spacer 82 on the base substrate is not overlapped with an orthographic projection of the first light transmission region A1 on the base substrate, and the orthographic projection of the post spacer 82 on the base substrate is not overlapped with an orthographic projection of the second light transmission region A2 on the base substrate, preventing from the light transmission effect is reduced because of an additional organic layer.

Figure 17:
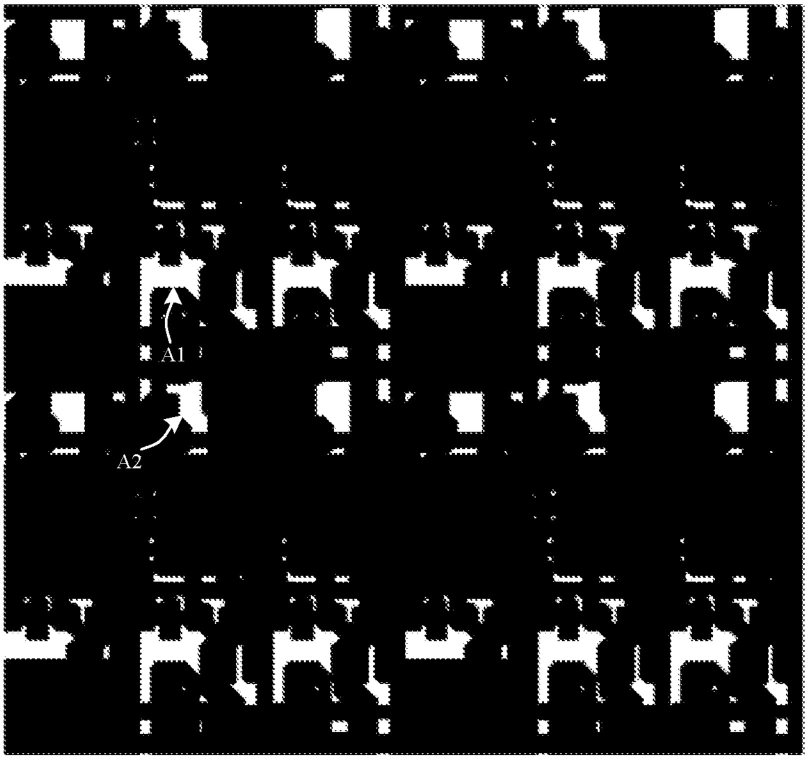
FIG. 17 is another schematic diagram of a light transmitting region of display substrate according to an exemplary embodiment of the present disclosure.

FIG. 17 is a schematic diagram of a transmitting region of another display substrate according to an exemplary embodiment of the present disclosure. As shown in FIG. 17, in at least one circuit unit of at least one circuit row, a first light transmitting region A1 with concentrated distribution and having a large area is formed close to the sixth transistor T6, and a second light transmitting region A2 with concentrated distribution and having a large area is formed close to the second transistor T2, so that the display substrate has a certain transmittance.

In an exemplary implementation, because an aperture ratio of the S-strip arrangement is different from that of the Delta arrangement, a proportion of an anode area of the S-strip arrangement is relatively small and a proportion of an anode area of the Delta arrangement is relatively large, so a transmittance of the S-strip arrangement is increased to a greater extent than that of the Delta arrangement.

In an exemplary implementation, a subsequent preparation process may include: forming an organic emitting layer using an evaporation or inkjet printing process, wherein the organic emitting layer is connected with an anode through a pixel opening, and forming a cathode on the organic emitting layer, wherein the cathode is connected with the organic emitting layer. An encapsulation structure layer is formed, and the encapsulation structure layer may include a first encapsulation layer, a second encapsulation layer, and a third encapsulation layer that are stacked, wherein the first encapsulation layer and the third encapsulation layer may be made of an inorganic material, the second encapsulation layer may be made of an organic material, and the second encapsulation layer is arranged between the first encapsulation layer and the third encapsulation layer, so that it may be ensured that external water vapor cannot enter a light emitting structure layer.

In a design of a pixel drive circuit of a display substrate, a light emitting control signal line is usually arranged on a side of a storage capacitor in the second direction Y, a first scan signal line is arranged on a side of the storage capacitor in an opposite direction of the second direction Y, a second scan signal line is arranged on a side of a first scan signal line away from the storage capacitor, an initial signal line is arranged on a side of the second scan signal line away from the storage capacitor, a first transistor T1 of a circuit unit of the present unit row is connected with a second transistor T2 of the circuit unit of the present unit row, and areas of electrode plates in the storage capacitor are large, so occupation areas of metal film layers in the circuit unit are large.

Exemplary embodiments of the present disclosure adjust layouts of the pixel drive circuits, wherein the first scan signal line is arranged on a side of the storage capacitor in the second direction, the light emitting control signal line is arranged on a side of the storage capacitor in an opposite direction of the second direction, a second scan signal line is arranged on a side of the light emitting control signal line away from the storage capacitor, the initial signal line is arranged on a side of the second scan signal line close to the storage capacitor, the second transistor T2 of the circuit unit of the present unit row is connected with the first transistor T1 of the circuit unit of the next unit row, which correspondingly reduces the areas of the first electrode plate and the second electrode plate in the storage capacitor, and achieves a compact layout structure among the transistors, the lines and the storage capacitor, thereby reducing the occupied areas of the metal film layers in the circuit unit. The first light transmitting region with a concentrated distribution and a large area is formed between the initial signal line and the light emitting control signal line of the present circuit unit, the second light transmitting region with a concentrated distribution and a large area is formed between the first scan signal line of the present circuit unit and the second scan signal line of the circuit unit of the next circuit row, and the light transmitting region may transmit light, which makes the display substrate has a certain transmittance. Compared with the existing structure with the same resolution (PPI), the transmittance of the display substrate of the present disclosure may be increased by 20% to 30%, and the transmission region is concentrated, which is beneficial for the sensor behind the display substrate to collect light. The preparation process in the present disclosure may be compatible well with an existing preparation process, is simple in process implementation, is easy to implement, and has a high production efficiency, a low production cost, and a high yield.

The aforementioned structure shown in the present disclosure and the preparation process thereof are merely exemplary description. In an exemplary implementation, corresponding structures may be changed and patterning processes may be added or reduced according to actual needs, which is not limited here in the present disclosure.

The present disclosure further provides a preparation method for a display substrate, for preparing the display substrate according to the foregoing embodiments. In an exemplary implementation, the preparation method may include:

- forming a drive circuit layer on a base substrate, which includes a plurality of circuit units forming a plurality of unit rows and a plurality of unit columns, wherein the circuit unit includes at least a pixel drive circuit, at least one circuit unit is provided with at least one light transmitting region having a second dimension, and the second dimension is a maximum distance between two edges of the light transmitting region;
- forming a light emitting structure layer on the drive circuit layer, wherein the light emitting structure layer includes a plurality of light emitting units forming a plurality of pixel rows and a plurality of pixel columns, the light emitting unit at least includes an anode, and the anode of at least one light emitting unit is connected with a pixel drive circuit of a corresponding circuit unit; and the light transmitting region is located between adjacent anodes, there is a first dimension between two adjacent anodes in two adjacent pixel rows, the first dimension is a minimum distance between edges of two adjacent anodes, and a ratio of the second dimension to the first dimension is greater than or equal to 0.5.

The present disclosure further provides a display apparatus which includes the aforementioned display substrate. The display apparatus may be any product or component with a display function, such as a mobile phone, a tablet computer, a television, a display, a laptop computer, a digital photo frame, or a navigator, which is not limited in the embodiments of the present invention.

Although the implementations disclosed in the present disclosure are described as above, the described contents are only implementations which are used for facilitating the understanding of the present disclosure, but are not intended to limit the present invention. Any skilled person in the art to which the present disclosure pertains may make any modifications and variations in forms and details of implementations without departing from the spirit and scope of the present disclosure. However, the patent protection scope of the present invention should be subject to the scope defined by the appended claims.

The invention claimed is:

1. A display substrate, comprising a drive circuit layer arranged on a base substrate and a light emitting structure layer arranged at a side of the drive circuit layer away from the base substrate, wherein:

the drive circuit layer comprises a plurality of circuit units forming a plurality of unit rows and a plurality of unit columns, and the light emitting structure layer comprises a plurality of light emitting units forming a plurality of pixel rows and a plurality of pixel columns; at least one circuit unit comprises at least a pixel drive circuit, a light emitting unit comprises at least one anode, and the at least one anode of the at least one light emitting unit is connected to the pixel drive circuit of a corresponding circuit unit; at least one circuit unit is provided with at least one light transmitting region located between adjacent anodes; there is a first dimension between two adjacent anodes in two adjacent pixel rows, and the light transmitting region has a second dimension, a ratio of the second dimension to the first dimension is greater than or equal to 0.5, the first dimension is a minimum distance between edges of two adjacent anodes, and the second dimension is a maximum distance between edges of the light transmitting region;

the pixel drive circuit at least comprises a storage capacitor, a first transistor, a second transistor, a third transistor, and a fourth transistor; in the circuit unit of at least one circuit row, a first electrode of the first transistor is connected to an initial signal line, a second electrode of the second transistor is connected to a second electrode of the third transistor, a first electrode of the third transistor is connected to a second electrode of the fourth transistor, and a first electrode of the fourth transistor is connected to a data signal line; the second transistor of at least one circuit unit of an M-th circuit row is arranged at a side of the storage capacitance close to an (M+1)-th circuit row, the first transistor of the at least one circuit unit of the M-th circuit row is arranged at a side of the storage capacitance away from the (M+1)-th circuit row, a first electrode of the second transistor of the at least one circuit unit of the M-th circuit row and a second electrode of the first transistor of the at least one circuit unit of the (M+1)-th circuit row are connected with each other to be of an integral structure, and M is a positive integer greater than or equal to 1; and at least one circuit unit further comprises a first scan signal line and a second scan signal line, the first scan signal line is connected to a gate electrode of the second transistor and a gate electrode of the fourth transistor, the second scan signal line is connected to a gate electrode of the first transistor; the first scan signal line of at least one circuit unit of the M-th circuit row is arranged at a side of the storage capacitance close to the (M+1)-th circuit row, and the second scan signal line of at least one circuit unit of the M-th circuit row is arranged at a side of the storage capacitance away from the (M+1)-th circuit row.

2. The display substrate according to claim 1, wherein: the plurality of light emitting units comprise a first light emitting unit which emits a first color light, a second light emitting unit which emits a second color light, and a third light emitting unit which emits a third color light, wherein the first light emitting unit, the second light emitting unit, and the third light emitting unit are periodically arranged in a direction of the pixel rows, the first light emitting unit, the second light emitting unit, and the third light emitting unit of adjacent pixel rows are dislocated, and anodes of the plurality of light emitting units in an odd-numbered pixel row and an adjacent even-numbered pixel row are correspondingly connected to pixel drive circuits of the plurality of circuit units in a same unit row.

3. The display substrate according to claim 2, wherein: the light transmitting region comprises a first light transmitting region and a second light transmitting region; the first light transmitting region is located between the anode of the first light emitting unit in the odd-numbered pixel row and the anode of the second light emitting unit in the adjacent even-numbered pixel row, and the second light transmitting region is located at a side of the anode of the second light emitting unit away from the first light transmitting region; or the first light transmitting region is located between the anode of the second light emitting unit in the odd-numbered pixel row and the anode of the third light emitting unit in the adjacent even-numbered pixel row, and the second light transmitting region is located at a side of the anode of the third light emitting unit away from the first light transmitting region; or the first light transmitting region is located between the anode of the third light emitting unit in the odd-numbered pixel row and the anode of the first light emitting unit in the adjacent even-numbered pixel row, and the second light transmitting region is located at a side of the anode of the first light emitting unit away from the first light transmitting region.

4. The display substrate according to claim 3, wherein an area of the first light transmitting region is larger than an area of the second light transmitting region.

5. The display substrate according to claim 3, wherein: a transmittance of the first light transmitting region is greater than or equal to 60%, and a transmittance of the second light transmitting region is greater than or equal to 60%.

6. The display substrate according to claim 1, wherein: the pixel drive circuit further comprises a fifth transistor and a sixth transistor, wherein a first electrode of the fifth transistor is connected to a first power supply line, a second electrode of the fifth transistor is connected to the first electrode of the third transistor, a first electrode of the sixth transistor is connected to the second electrode of the third transistor, and a second electrode of the sixth transistor is connected to the anode; at least one circuit unit further comprises a light emitting control signal line, which is connected to a gate electrode of the fifth transistor and a gate electrode of the sixth transistor; and in at least one circuit unit, the light emitting control signal line is arranged at a side of the second scan signal line close to the storage capacitor.

7. The display substrate according to claim 6, wherein: in at least one circuit unit of at least one circuit row, a first pitch between an edge of the first scan signal line close to the light emitting control signal line and an edge of the light emitting control signal line close to the first scan signal line is 0.33*L to 0.37*L, and L is a dimension of the circuit unit in a direction of the unit columns.

8. The display substrate according to claim 6, wherein: in at least one circuit unit of at least one circuit row, a second pitch between an edge of the second scan signal line close to the light emitting control signal line and an edge of the light emitting control signal line close to the second scan signal line is 0.20*L to 0.24*L, and L is a dimension of the circuit unit in a direction of the unit columns.

9. The display substrate according to claim 6, wherein: in at least one circuit unit, the initial signal line is arranged between the second scan signal line and the light emitting control signal line.

10. The display substrate according to claim 9, wherein: in at least one circuit unit of at least one circuit row, a third pitch between an edge of the initial signal line close to the light emitting control signal line and an edge of the light emitting control signal line close to the initial signal line is 0.12*L to 0.16*L, and L is a dimension of the circuit unit in a direction of the unit columns.

11. The display substrate according to claim 9, wherein: at least one circuit unit is formed with a first light transmitting region of the light transmitting region, an orthographic projection of the first light transmitting region on a plane of the display substrate has a first projection area, the first projection area is greater than or equal to 0.02*S, and S is an area of an orthographic projection of the circuit unit on the plane of the display substrate.

12. The display substrate according to claim 11, wherein: in a direction of the unit rows, the first light transmitting region is located between a second electrode of the sixth transistor and the first power supply line, and in a direction of the unit columns, the first light transmitting region is located between the initial signal line and the light emitting control signal line.

13. The display substrate according to claim 9, wherein: at least one circuit unit is formed with a second light transmitting region of the light transmitting region, an orthographic projection of the second light transmitting region on a plane of the display substrate has a second projection area, the second projection area is greater than or equal to 0.02*S, and S is an area of an orthographic projection of the circuit unit on the plane of the display substrate.

14. The display substrate according to claim 13, wherein: in a direction of the unit rows, the second light transmitting region is located between the data signal line and the first power supply line, and in a direction of the unit columns, the second light transmitting region is located between the first scan signal line of the circuit unit in the M-th circuit row and the second scan signal line of the circuit unit in the (M+1)-th circuit row.

15. The display substrate according to claim 1, wherein: the storage capacitor comprises a first electrode plate, a second electrode plate, and a dielectric layer arranged between the first electrode plate and the second electrode plate, an orthographic projection of the first electrode plate on a plane of the display substrate is at least partially overlapped with an orthographic projection of the second electrode plate on the plane of the display substrate, and a thickness of the dielectric layer is 90 nm to 110 nm.

16. The display substrate according to claim 15, wherein: the first electrode plate has a first length, the second electrode plate has a second length, the first length is 0.25*L to 0.30*L, the second length is 0.30*L to 0.33*L, the first length is a dimension of the first electrode plate in a direction of the unit columns, the second length is a dimension of the second electrode plate in the direction of the unit columns, and L is a dimension of the circuit unit in the direction of the unit columns.

17. The display substrate according to claim 1, wherein: the light emitting structure layer further comprises a pixel definition layer, the pixel the definition layer is provided with a plurality of pixel openings and post spacers, at least one pixel opening exposes the anode, and the post spacers are arranged between adjacent pixel openings; in one unit row, an orthographic projection of at least one post spacer on the base substrate is at least partially overlapped with an orthographic projection of the first transistor on the base substrate, and in adjacent another unit row, an orthographic projection of at least one post spacer on the base substrate is at least partially overlapped with an orthographic projection of the storage capacitor on the base substrate.

18. A display apparatus, comprising a display substrate according to claim 1.

* * * * *